(12) United States Patent
Park et al.

(10) Patent No.: US 10,108,284 B2
(45) Date of Patent: Oct. 23, 2018

(54) FOLDABLE DISPLAY DEVICE AND METHOD FOR FABRICATING THE SAME

(71) Applicant: Samsung Display Co., Ltd., Yongin-si (KR)

(72) Inventors: Yongjun Park, Yongin-si (KR); Jin Seo, Osan-si (KR); Youngsuk Lee, Hwaseong-si (KR); Jongsoo Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/446,203

(22) Filed: Mar. 1, 2017

(65) Prior Publication Data
US 2017/0255309 A1 Sep. 7, 2017

(30) Foreign Application Priority Data
Mar. 2, 2016 (KR) .................. 10-2016-0025220

(51) Int. Cl.
*G06F 3/045* (2006.01)
*G06F 3/041* (2006.01)
(Continued)

(52) U.S. Cl.
CPC .......... *G06F 3/0412* (2013.01); *G06F 1/1643* (2013.01); *G06F 1/1652* (2013.01);
(Continued)

(58) Field of Classification Search
CPC ...... G06F 3/0412; G06F 3/044; G06F 1/1643; G06F 1/1652; G06F 2203/04102; G06F 2203/04103; H01L 27/323; H01L 27/3276; H01L 51/5253; H01L 51/5293; H01L 51/56; H01L 2227/323; H01L 2227/5338

See application file for complete search history.

(56) References Cited

U.S. PATENT DOCUMENTS 7,645,934 B1 * 1/2010 Fidanza ................ H01L 31/036
 136/263
2004/0080688 A1 * 4/2004 Ishida ................... G02F 1/1345
 349/113

(Continued)

FOREIGN PATENT DOCUMENTS

| KR | 10-0806704 | 2/2008 |
| KR | 10-2014-0120556 | 10/2014 |
| KR | 10-2015-0042011 | 4/2015 |

OTHER PUBLICATIONS

Kesapragada et al. (S.V. Kesapragada , P. Victor, O. Nalamasu, D. Gall, "Nanospring Pressure Sensors Grown by Glancing Angle Deposition", Nano Letters 2006, vol. 6, No. 4, 854-857, published on web Mar. 16, 2006).*

(Continued)

*Primary Examiner* — Mark Edwards
(74) *Attorney, Agent, or Firm* — H.C. Park & Associates, PLC

(57) ABSTRACT

A foldable display device includes a display panel having a bent display portion and a non-bent display portion, and a touch sensing unit provided on the display panel and including a bent touch portion and a non-bent touch portion. The touch sensing unit includes a plurality of sensing electrodes, and each of the sensing electrodes comprises a conductive material having a porous structure. The porous structure resists cracking and the resulting sensing electrodes may have an optical anisotropy. Thus, the sensing electrodes may perform a polarizing function to eliminate need for a separate polarizer.

18 Claims, 19 Drawing Sheets

(51) Int. Cl.
  *H01L 27/32* (2006.01)
  *H01L 51/56* (2006.01)
  *H01L 51/52* (2006.01)
  *G06F 1/16* (2006.01)
  *G06F 3/044* (2006.01)
(52) U.S. Cl.
  CPC ............ *G06F 3/044* (2013.01); *H01L 27/323* (2013.01); *H01L 27/3276* (2013.01); *H01L 51/5253* (2013.01); *H01L 51/5293* (2013.01); *H01L 51/56* (2013.01); *G06F 2203/04102* (2013.01); *G06F 2203/04103* (2013.01); *H01L 2227/323* (2013.01); *H01L 2251/5338* (2013.01)

(56) References Cited

U.S. PATENT DOCUMENTS

| | | | | |
|---|---|---|---|---|
| 2007/0181906 A1* | 8/2007 | Chik | ............... | B82Y 20/00 257/103 |
| 2010/0218979 A1* | 9/2010 | Chang | ............... | B82Y 10/00 174/250 |
| 2013/0209780 A1* | 8/2013 | Poxson | ............... | C23C 14/083 428/312.6 |
| 2015/0015530 A1* | 1/2015 | Kim | ............... | G06F 3/044 345/174 |
| 2015/0103032 A1* | 4/2015 | Bell | ............... | G06F 3/044 345/174 |
| 2015/0140213 A1 | 5/2015 | Taschuk et al. | | |
| 2015/0227172 A1* | 8/2015 | Namkung | ............... | G06F 1/1652 345/173 |
| 2016/0093827 A1* | 3/2016 | Han | ............... | H01L 51/5246 257/40 |

OTHER PUBLICATIONS

Suzuki, M. and Y. Taga, "Anisotropy in the optical absorption of Ag—SiO2 thin films with oblique columnar structures", Journal of Applied Physics 71, 2848 (1992); doi: 10.1063/1.351368, retrieved on web May 31, 2018).*

Khanarian et al., "The optical and electrical properties of silver nanowire mesh films", Journal of Applied Physics 114, Jul. 8, 2013, pp. 024302 1-024302 14, AIP Publishing, Online.

* cited by examiner

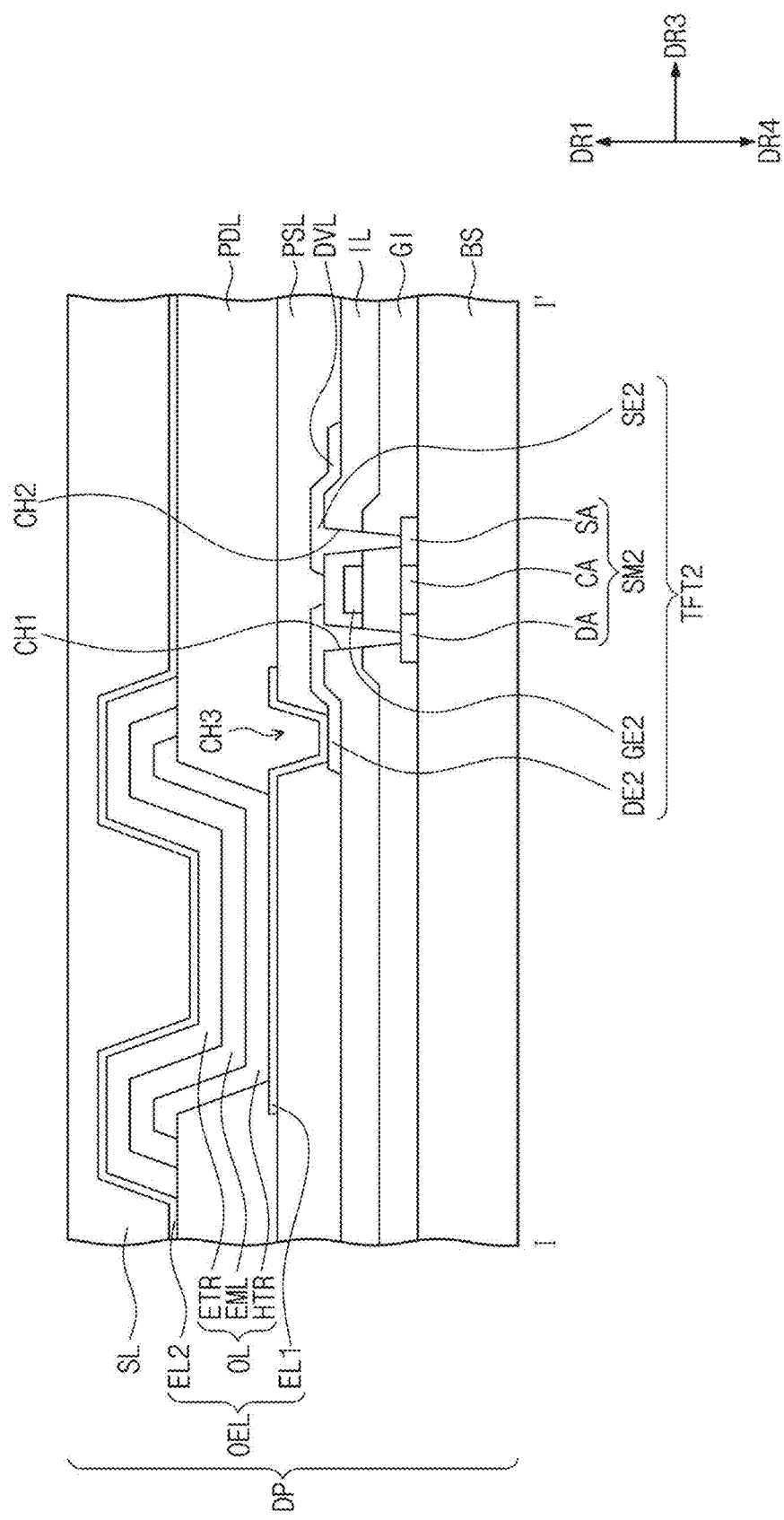

FOLDABLE DISPLAY DEVICE AND METHOD FOR FABRICATING THE SAME

CROSS-REFERENCE TO RELATED APPLICATION

This application claims priority from and the benefit of Korean Patent Application No. 10-2016-0025220, filed on Mar. 2, 2016, which is hereby incorporated by reference for all purposes as if fully set forth herein.

BACKGROUND

Field

The present disclosure herein relates to a foldable display device and a method for fabricating the same.

Discussion of the Background

A display device displays various images on a display screen to provide information to a user. The display device may include a display panel and a touch sensing unit. In recent years, bendable display devices have been under development. Foldable display devices may be folded or bent like a paper, unlike flat panel display devices. Such foldable display devices may be easily carried and improve user's convenience based on their ability to change shape.

The touch sensing unit is an input unit through which an indicated contact displayed on a screen of the display panel is selected by using a person's hand or an object to input a user's command. For example, the touch sensing unit may be disposed on a front face of the display panel to convert a contact position directly contacting a person's hand or an object into an electrical signal. As a result, the indicated contact selected at the contact position may be received as an input signal. As described above, since the touch sensing unit can replace other input devices that attach to displays, such as keyboards and mice, the use of touch sensing units has recently been increasing.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present disclosure provide a foldable display device that minimizes an occurrence of cracks when being bent.

Exemplary embodiments of the present disclosure also provide a foldable display device including sensing electrodes that are capable of performing a polarizing function.

Exemplary embodiments of the present disclosure also provide a method for fabricating a foldable display device that is capable of reducing an occurrence of cracks when being bent.

Exemplary embodiments of the present disclosure further provide a method for fabricating a foldable display device including sensing electrodes that are capable of performing a polarizing function.

Additional aspects will be set forth in the detailed description which follows, and, in part, will be apparent from the disclosure, or may be learned by practice of the inventive concept.

An exemplary embodiment of the present disclosure provides a foldable display device including: a display panel including a bent display portion and a non-bent display portion; and a touch sensing unit provided on the display panel and including a bent touch portion and a non-bent touch portion, wherein the touch sensing unit includes a plurality of sensing electrodes, and each of the sensing electrodes comprises a conductive material having a porous structure.

In another exemplary embodiment of the present disclosure, a method for fabricating a foldable display device includes: providing a substrate and a deposition source within a chamber; and depositing a conductive material on the substrate to provide one or more sensing electrodes, wherein the providing of the sensing electrodes includes: disposing the substrate and the deposition source so that a deposition angle between the substrate and the deposition source is equal to or more than about 40 degrees to less than about 70 degrees; and depositing the conductive material on the substrate, wherein the deposition angle is defined as an angle between a virtual first plane and a virtual second plane on a tangent at which the virtual first plane extending from the substrate and the virtual second plane extending from the deposition source meet each other.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 2C is a schematic cross-sectional view taken along line I-I' of FIG. 2B.

DETAILED DESCRIPTION OF THE ILLUSTRATED EMBODIMENTS

Figure 1A:
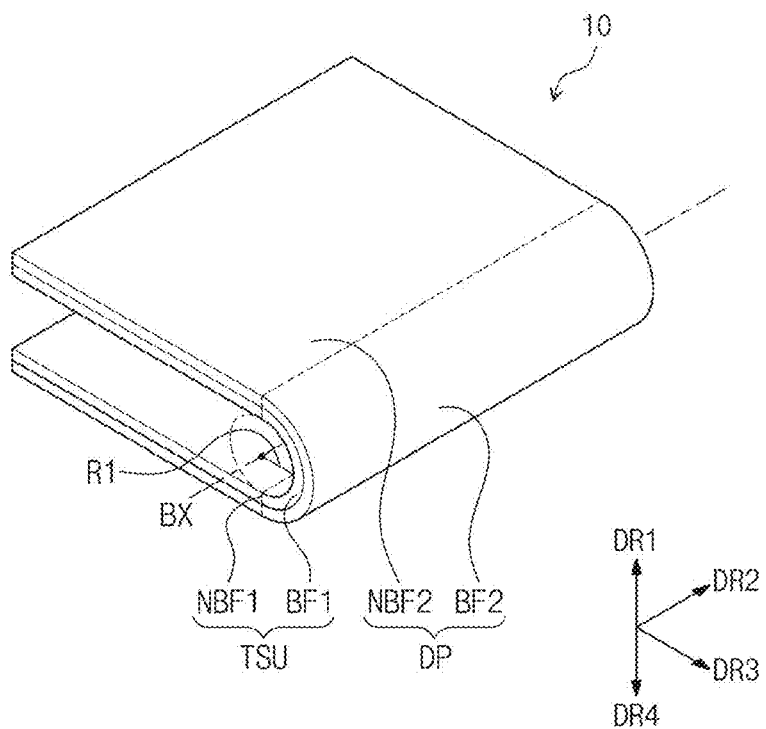
FIG. 1A and FIG. 1B are schematic perspective views of a foldable display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
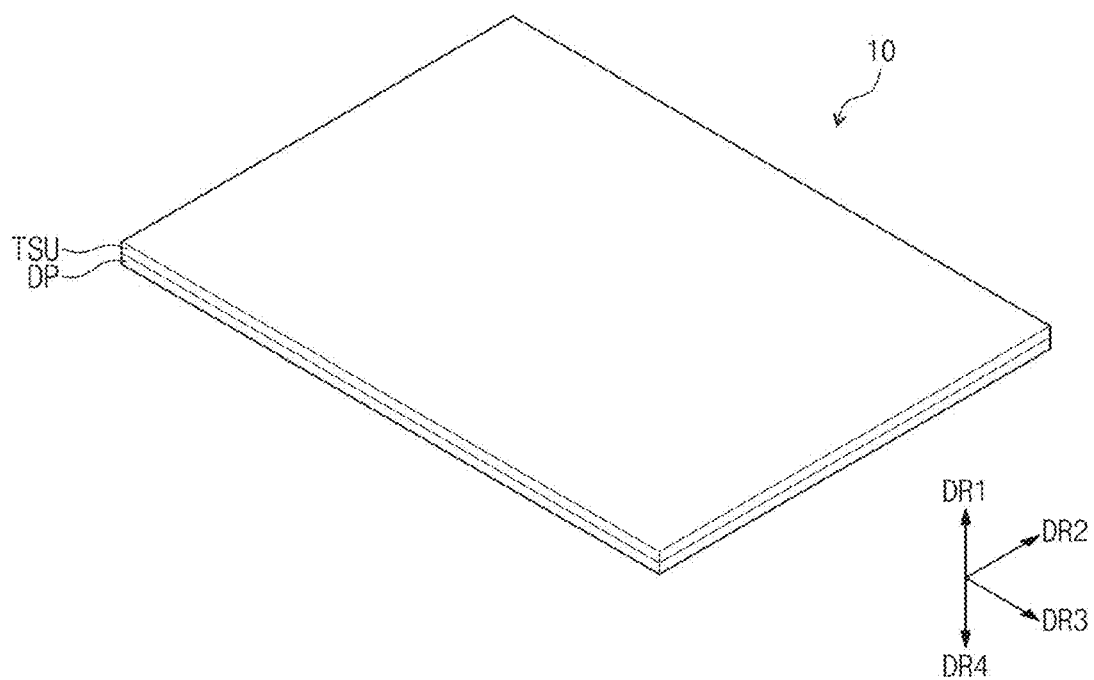

FIGS. 1A and 1B are schematic perspective views of a foldable display device according to an exemplary embodiment of the present disclosure.

Referring to FIGS. 1A and 1B, a foldable display device 10 according to an exemplary embodiment of the present disclosure includes a display panel DP and a touch sensing unit TSU. The touch sensing unit TSU is disposed on the display panel DP.

The display device 10 according to an exemplary embodiment of the present disclosure may operate in a first mode or a second mode. The display panel DP and the touch sensing unit TSU include a bent portion and a non-bent portion, respectively. Particularly, the touch sensing unit TSU includes a bent touch portion BF1 and a non-bent touch portion NBF1, and the display panel DP includes a bent display portion BF2 and a non-bent display portion NBF2. The bent touch portion BF1 is bent in one direction with respect to a bending axis BX extending in a second direction DR2 in the first mode. The bent display portion BF2 is bent in one direction with respect to the bending axis BX extending in the second direction DR2 in the first mode. The non-bent touch portion NBF1 is unfolded in the second mode. The non-bent display portion NBF2 is unfolded in the second mode. The non-bent touch portion NBF1 is connected to the bent touch portion BF1. The non-bent display portion NBF2 is connected to the bent display portion BF2. The non-bent touch portion NBF1 is not bent in the first and second modes. The non-bent display portion NBF2 is not bent in the first and second modes.

In this specification, the term "bending" may mean that the display panel DP and the touch sensing unit TSU are bent in a specific shape by external force.

When the display device 10 is bent about the bending axis BX, although, each of a distance between bent portions facing each other of the touch sensing unit TSU and a distance between bent portions facing each other of the display panel DP is constant in FIG. 1A, exemplary embodiments of the present disclosure are not limited thereto. For example, each of the distance between the bent portions facing each other of the touch sensing unit TSU and the distance between the bent portions facing each other of the display panel DP may not be constant. Also, when the display device 10 is bent about the bending axis BX, although each of areas of the bent portions facing each other of the touch sensing unit TSU in a first direction DR1 and areas of the bent portions facing each other of the display panel DP are the same in FIG. 1A, exemplary embodiments of the present disclosure are not limited thereto. For example, each of the areas of the bent portions facing each other of the touch sensing unit TSU and the areas of the bent portions facing each other of the display panel DP may be different from each other.

One surface of the bent touch portion BF1 may have a first curvature radius R1. The first curvature radius R1 may be, for example, about 1 mm to about 10 mm.

The touch sensing unit TSU may recognize user's direct touch, user's indirect touch, object's direct touch, or object's indirect touch. The direct touch means a case in which the user or the object directly contacts the touch sensing unit TSU. The indirect touch means a case in which the touch sensing unit TSU recognizes the touch even if the user or the object does not directly touch the touch sensing unit TSU because the touch sensing unit TSU is positioned at a distance at which the touch sensing unit TSU is capable of recognizing the touch of the user or the object.

Hereinafter, although the display panel DP including an organic light emitting display panel is exemplified, exemplary embodiment of the present disclosure are not limited thereto. For example, the display panel may include a liquid crystal display panel, a plasma display panel, an electrophoretic display panel, a microelectromechanical system (MEMS) display panel, and an electrowetting display panel.

Figure 2A:
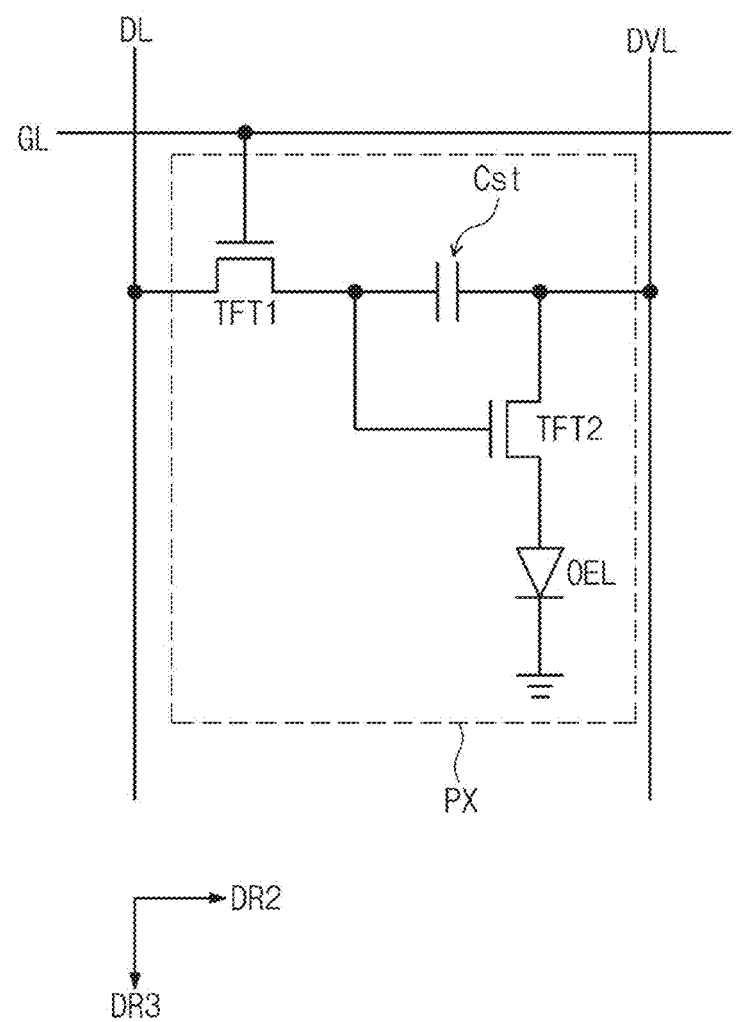
FIG. 2A is a circuit view illustrating one of pixels provided in a display panel provided in the foldable display device according to an exemplary embodiment of the present disclosure.
Figure 2B:
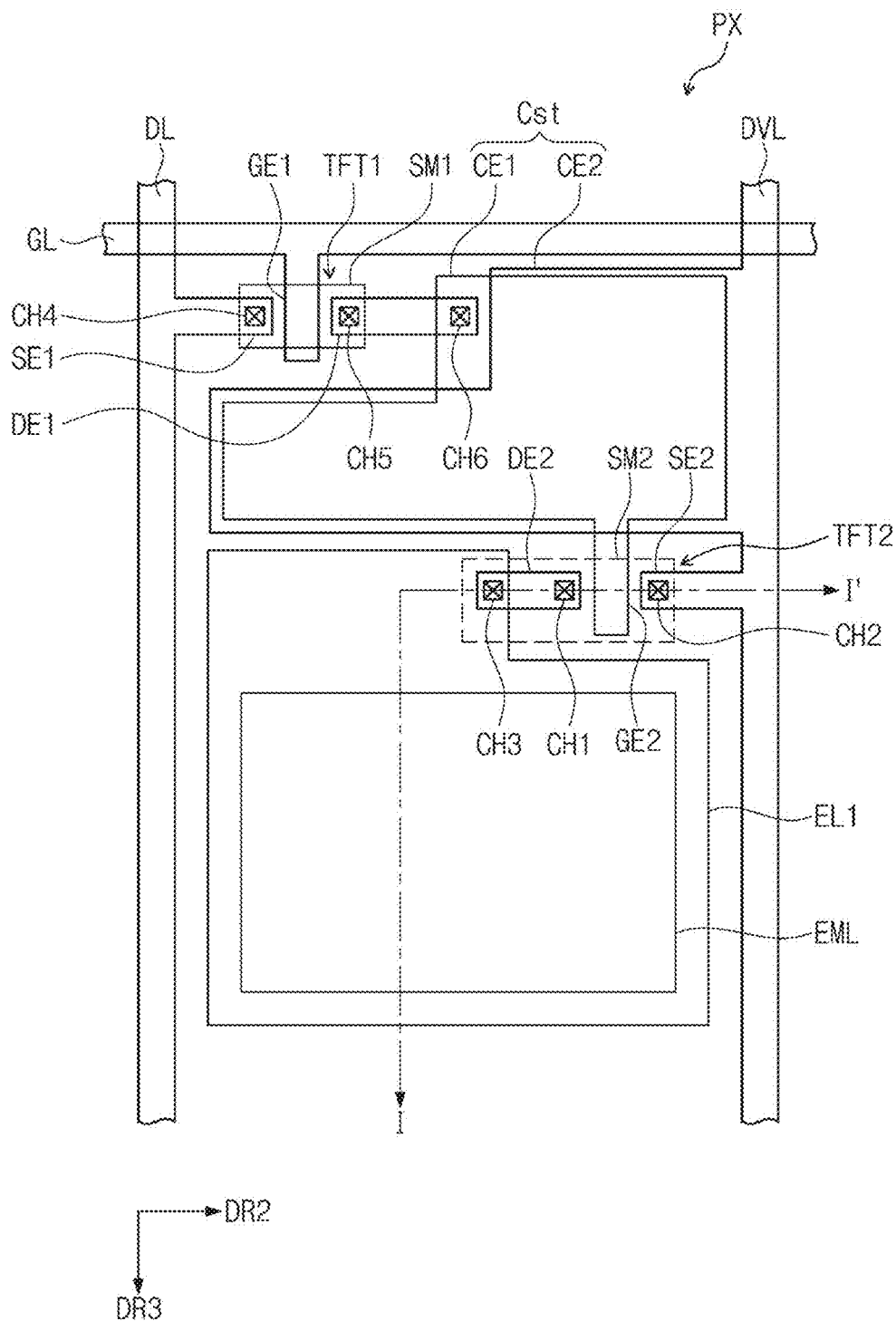
FIG. 2B is a plan view illustrating one of the pixels provided in the display panel provided in the foldable display device according to an exemplary embodiment of the present disclosure.

FIG. 2A is a circuit view illustrating one of pixels provided in the display panel provided in the foldable display device according to an exemplary embodiment of the present disclosure. FIG. 2B is a plan view illustrating one of the pixels provided in the display panel provided in the foldable display device according to an exemplary embodiment of the present disclosure. FIG. 2C is a schematic cross-sectional view taken along line I-I' of FIG. 2B.

Referring to FIGS. 2A to 2C, each of pixels PX may be connected to a line part constituted by gate lines GL, data lines DL, and driving voltage lines DVL. Each of the pixels PX includes thin film transistors TFT1 and TFT2 connected to the line part, an organic electroluminescent device (OEL) connected to the thin film transistors TFT1 and TFT2, and a capacitor Cst.

Although one pixel is connected to one gate line, one data line, and one driving voltage line in an exemplary embodiment of the present disclosure, exemplary embodiments of the present disclosure are not limited thereto. For example, a plurality of pixels PX may be connected to one gate line, one data line, and one driving voltage line. Also, one pixel may be connected to at least one gate line, at least one data line, and at least one driving voltage line.

The gate lines GL extend in the second direction DR2. The data lines DL extend in a third direction crossing the gate lines GL. The driving voltage lines DVL extend in substantially the same direction as the data lines DL, for example in the third direction DR3. The gate lines GL transmit scanning signals into the thin film transistors TFT1 and TFT2, the data lines DL transmit data signals into the thin film transistors TFT1 and TFT2, and the driving voltage lines DVL provide a driving voltage to the thin film transistors TFT1 and TFT2.

Each of the pixels PX may emit light having a specific color, for example, one of red light, green light, and blue light. A kind of color light is not limited to the above-described light. For example, the color light may further include white light, cyan light, magenta light, and yellow light.

The thin film transistors TFT1 and TFT2 may include a driving thin film transistor TFT2 for controlling the organic electroluminescent device OEL and a switching thin film transistor TFT1 for switching the driving thin film transistor TFT2. Each of the pixels PX includes the two thin film transistors TFT1 and TFT2 in an exemplary embodiment of the present disclosure, but is not limited thereto. For example, each of the pixels PX may include one thin film transistor and capacitor or include at least three thin film transistors and at least two capacitors.

The switching thin film transistor TFT1 includes a first gate electrode GE1, a first source electrode SE1, and a first drain electrode DE1. The first gate electrode GE1 is connected to the gate lines GL, and the first source electrode SE1 is connected to the data lines DL. The first drain electrode DE1 is connected to a first common electrode CE1 by a fifth contact hole CH5. The switching thin film transistor TFT1 transmits the data signals applied into the data lines DL into the driving thin film transistor TFT2 according to the scanning signals applied into the gate lines GL.

The driving thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage lines DVL. The second drain electrode DE2 is connected to an anode EL1 by a third contact hole CH3.

The anode EL1 is connected to the second drain electrode DE2 of the driving thin film transistor TFT2. A common voltage is applied to a cathode EL2, and a light emitting layer EML emits light according to an output signal of the driving thin film transistor TFT2 to display an image. The anode EL1 and the cathode EL2 will be described below in more detail.

The capacitor Cst is connected between the second gate electrode GE2 and the second source electrode SE2 of the driving thin film transistor TFT2 to charge and maintain the data signal inputted into the second gate electrode GE2 of the driving thin film transistor TFT2. The capacitor Cst may include the first common electrode CE1 connected to the first drain electrode DE1 by a sixth contact hole CH6 and a second common electrode CE2 connected to the driving voltage lines DVL.

Referring to FIGS. 2A to 2C, the display panel DP provided in the foldable display device 10 according to an exemplary embodiment of the present disclosure include a base substrate BS, the thin film transistors TFT1 and TFT2 disposed on the base substrate BS, and the organic electroluminescent device connected to the thin film transistors TFT1 and TFT2.

The base substrate BS may be a flexible substrate having flexibility. The base substrate BS is not specifically limited to a material thereof if the material for forming the base substrate BS is commonly used. For example, the base substrate may include plastic and an organic polymer. For example, the base substrate BS may include at least one of polyethylene terephthalate (PET), polyethylene naphthalate (PEN), polyimide, and polyether sulfone. The base substrate BS may be adequately selected in consideration of mechanical strength, thermal stability, transparency, surface roughness, tractability, waterproofing property, and the like. The base substrate BS may be transparent.

A substrate buffer layer (not shown) may be disposed on the base substrate BS. The substrate buffer layer (not shown) may prevent impurities from being diffused into the switching thin film transistor TFT1 and the driving thin film transistor TFT2. The substrate buffer layer (not shown) may be made of $SiN_x$, $SiO_x$, or $SiO_xN_y$. Also, the substrate buffer layer (not shown) may be omitted according to the material and process conditions of the base substrate BS.

A first semiconductor pattern SM1 and a second semiconductor pattern SM2 are disposed on the base substrate BS. Each of the first and second semiconductor patterns SM1 and SM2 is made of a semiconductor material. Also, the first and second semiconductor patterns SM1 and SM2 may function as active layers of the switching and driving thin film transistors TFT1 and TFT2, respectively. Each of the first semiconductor pattern SM1 and the second semiconductor pattern SM2 includes a source part SA, a drain part DA, and a channel part disposed between the source part SA and the drain part DA. Each of the first and second semiconductor patterns SM1 and SM2 may be made of a material selected from an inorganic semiconductor and an organic semiconductor. The source part SA and the drain part DA may be doped within n-type impurities or p-type impurities.

A gate insulation layer GI is disposed on the first and second semiconductor patterns SM1 and SM2. The gate insulation layer GI covers the first and second semiconductor patterns SM1 and SM2. The gate insulation layer GI may be made of an organic insulation material or inorganic insulation material.

First and second gate electrodes GE1 and GE2 are disposed on the gate insulation layer GI. Each of the first and second gate electrodes GE1 and GE2 covers an area corresponding to the drain part DA of each of the first and second semiconductor patterns SM1 and SM2.

A substrate insulation layer IL is disposed on the first and second gate electrodes GE1 and GE2. The substrate insulation layer IL covers the first and second gate electrodes GE1 and GE2. The substrate insulation layer IL may be made of an organic insulation material or inorganic insulation material.

The first source and drain electrodes SE1 and DE1 and the second source and drain electrodes SE2 and DE2 are disposed on the substrate insulation layer IL. The second drain electrode DE2 contacts the drain part DA of the second semiconductor pattern SM2 by a first contact hole CH1 defined in the gate insulation layer GI and the substrate insulation layer IL, and the second source electrode SE2 contacts the source part SA of the second semiconductor pattern SM2 by a second contact hole Ch2 defined in the gate insulation layer GI and the substrate insulation layer IL. The first source electrode SE1 contacts a source part (not shown) of the first semiconductor pattern SM1 by a fourth contact hole CH4 defined in the gate insulation layer GI and the substrate insulation layer IL, and the first drain electrode DE1 contacts a drain part (not shown) of the first semiconductor pattern SM1 by a fifth contact hole CH5 defined in the gate insulation layer GI and the substrate insulation layer IL.

A passivation layer PL is disposed on the first source and drain electrodes SE1 and DE1 and the second source and drain electrodes SE2 and DE2. The passivation layer PL may function as a protection layer for protecting the switching thin film transistor TFT1 and the driving thin film transistor TFT 2 and also function as a planarization layer for planarizing top surfaces of the switching thin film transistor TFT1 and the driving thin film transistor TFT 2.

The anode EL1 is disposed on the passivation layer PL. For example, the anode EL1 may be a positive electrode. The anode EL1 is connected to the second drain electrode DE2 of the driving thin film transistor TFT2 through the third contact hole CH3 defined in the passivation layer PL.

A pixel defining layer PDL partitioning the light emitting layer EML to respectively correspond to the pixels PX is disposed on the passivation layer PL. The pixel defining layer PDL exposes a top surface of the anode EL1 and protrudes from the base substrate SUB. The pixel defining layer PDL may include, but is not limited to a material thereof, a metal-fluorine ion compound. For example, the pixel defining layer PDL may be formed of one metal-fluorine ion compound of LiF, BaF2, and CsF. If the metal-fluorine ion compound has a predetermined thickness, the metal-fluorine ion compound may have an insulating property. For example, the pixel defining layer PDL may have a thickness of about 10 nm to about 100 nm.

The organic electroluminescent device OEL is disposed on an area that is surrounded by the pixel defining layer PDL. The organic electroluminescent device OEL includes the anode EL1, an organic layer OL, and the cathode EL2, which are successively laminated. The organic layer OL includes a hole transport region HTR, the light emitting layer EML, and an electron transport region ETR.

The anode EL1 has conductivity. The anode EL1 may be a pixel electrode or a positive electrode. The anode EL1 may be a transmissive electrode, a transflective electrode, or a reflective electrode. When the anode EL1 is the transmissive electrode, the anode EL1 may be made of metal oxide, for example, indium tin oxide (ITO), indium zinc oxide (IZO), zinc oxide (ZnO), or indium tin zinc oxide (ITZO). When the anode EL1 is the transflective or reflective electrode, the anode EL1 may include at least one of Ag, Mg, Al, Pt, Pd, Au, Ni, Nd, Ir, or Cr.

The organic layer OL is disposed on the anode EL1. The organic layer OL includes the light emitting layer EML. The organic layer OL may further the hole transport region HTR and the electron transport region ETR.

The hole transport region HTR is defined on the anode EL1. The hole transport region HTR may include at least one of a hole injection layer, a hole transport layer, a buffer layer, or an electron stop layer. The hole transport region HTR may have a single layer made of a single material, a single layer made of materials different from each other, or a multi-layered structure including a plurality of layers made of materials different from each other.

For example, the hole transport region HTR may have a structure of single layers made of a plurality of different materials or a structure of the hole injection layer/the hole transport layer, the hole injection layer/the hole transport layer/the buffer layer, the hole injection layer/the buffer layer, the hole transport layer/the buffer layer, or the hole injection layer/the hole transport layer/the electron stop layer, which are successively laminated from the anode EL1, but exemplary embodiments of the present disclosure are not limited thereto.

When the hole transport region HTR includes the hole injection layer, the transport region HTR may include a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methyl-phenylphenylamino) triphenylamine (m-MTDATA), 4,4'4"-Tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate (PEDOT/PSS), polyaniline/dodecylbenzenesulfonic acid (PANI/DBSA), polyaniline/camphor sulfonicacid (PANI/CSA), and polyaniline/poly(4-styrenesulfonate) (PANI/PSS), but exemplary embodiments of the present disclosure are not limited thereto.

When the hole transport region HTR includes the hole transport layer, the hole transport region HTR may include, for example, a carbazole-based derivative such as N-phenylcarbazole and polyvinylcarbazole, a fluorene-based derivative, a triphenylamine-based derivative such as N,N'-bis(3-methylphenyl)-N,N'-dipheny-[1,1-biphenyl]-4,4'-diamine (TPD) and 4,4',4"-tris(N-carbazolyl)triphenylamine (TCTA), N,N'-di(1-naphthyl)-N,N'-diphenylbenzidine (NPB), or 4.4'-Cyclohexylidene bis[N,N-bis(4-methylphenyl)benzenamine] (TAPC), but exemplary embodiments of the present disclosure are not limited thereto.

The light emitting layer EML may be disposed on the hole transport region HTR. The light emitting layer EML may have a single layer structure formed of a single material, a single layer structure formed of materials different from each other, or a multi-layered structure including a plurality of layers formed of materials different from each other.

The light emitting layer EML is not specifically limited to a material if the material for forming the light emitting layer EML is usually used. For example, the light emitting layer EML may be formed of materials that emit red, green, and blue colors. Alternatively, the light emitting layer may include a phosphor material and a fluorescent material. Also, the light emitting layer EML may include a host or dopant.

The host is not specifically limited if the host material is capable of being generally used. For example, the host may include Alq3(tris(8-hydroxyquinolino)aluminum), CBP(4,4'-bis(N-carbazolyl)-1,1'-biphenyl), PVK(poly(n-vinylcabazole)), ADN(9,10-di(naphthalene-2-yl)anthracene), TCTA (4,4',4"-Tris(carbazol-9-yl)-triphenylamine), TPBi(1,3,5-tris(N-phenylbenzimidazole-2-yl)benzene), TBADN(3-tert-butyl-9,10-di(naphth-2-yl)anthracene), DSA (distyrylarylene), CDBP(4.4'-bis(9-carbazolyl)-2,2'-dimethyl-biphenyl), MADN(2-Methyl-9,10-bis(naphthalen-2-yl)anthracene).

When the light emitting layer EML emits red light, the light emitting layer EML may include, for example, a fluorescent material including tris(dibenzoylmethanato) phenanthoroline europium (PBD:Eu(DBM)3(Phen)) and perylene. When the light emitting layer EML emits red light, the dopant material contained in the light emitting layer EML may be, for example, selected from a metal complex or an organometallic complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP).

When the light emitting layer EML emits green light, the light emitting layer EML may include, for example, a fluorescent material including Alq3(tris(8-hydroxyquinolino)aluminum. When the light emitting layer EML emits the green light, the dopant contained in the light emitting layer EML may be selected from, for example, a metal complex or organometallic complex such as Ir(ppy)3(fac-tris(2-phenylpyridine)iridium.

When the light emitting layer EML emits blue light, the light emitting layer EML may include, for example, a fluorescent material including at least one selected from the group consisting spiro-DPVBi, spiro-6P, distyryl-benzene (DSB), distyryl-arylene (DSA), polyfluorene (PFO)-based polymer or poly(p-phenylene vinylene (PPV)-based polymer. When the light emitting layer EML emits the blue light, the dopant contained in the light emitting layer EML may be selected from, for example, a metal complex or organometallic complex such as (4,6-F2ppy)2Irpic. The light emitting layer EML will be described below in detail.

The electron transport region ETR may be disposed on the light emitting layer EML. The electron transport region may include at least one of a hole stop layer, an electron transport layer, or an electron injection layer, but exemplary embodiments of the present disclosure are not limited thereto.

When the electron transport region includes the electron transport layer, the electron transport region may include Tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate (Bebq2), 9,10-di(naphthalene-2-yl) anthracene (AND), and a mixture thereof, but exemplary embodiments of the present disclosure are not limited thereto.

When the electron transport region includes the electron injection layer, the electron transport region may be formed of a material selected from lanthanum metals such as LiF, Lithium quinolate (LiQ), $Li_2O$, BaO, NaCl, CsF, and Yb or metal halides such as RbCl and RbI. The electron injection layer may be formed of a mixture of the material for the electron transport material and an organo metal salt. The organo metal salt may be a material having an energy band gap of about 4 eV or more. For example, the organo metal salt may include metal acetate, metal benzoate, metal acetoacetate, metal acetylacetonate, or metal stearate. Each of the electron injection layers may have a thickness of about 1 Å to about 100 Å, for example, about 3 Å to about 90 Å. When each of the electron injection layers has a thickness within the above-described range, satisfactory electron injection characteristics may be achieved without substantially increasing in driving voltage.

The cathode EL2 may be disposed on the electron transport region HTR. The cathode EL2 may be a common electrode or a negative electrode. The cathode EL2 may be a transmissive electrode, a transflective electrode, or a reflective electrode. When the cathode EL2 is the transmissive electrode, the cathode EL2 may include Li, Ca, LiF/Ca, LiF/Al, Al, Mg, BaF, Ag or a compound or mixture (e.g., a mixture of Ag and Mg) thereof.

When the cathode EL2 is the transflective electrode or the reflective electrode, the cathode EL2 may include Ag, Mg, Al, Pt, Pd, Au, Ni, Nd, Ir, Cr, Li, Ca, LiF/Ca, LiF/Al, Mo, Ti, or a compound or mixture (e.g., a mixture of Ag and Mg) thereof. The cathode EL2 may have a multi-layered structure including a reflective film or transflective film made of Ag, Mg, Cu, Al, Pt, Pd, Au, Ni, Nd, Ir, Cr, Li, Ca, LiF/Ca, LiF/Al, Mo, Ti or a compound or mixture thereof and a transparent conductive layer formed of indium tin oxide (ITO), indium zinc oxide (IZO), zinc oxide (ZnO), or indium tin zinc oxide (ITZO).

The cathode EL2 may be connected to an auxiliary electrode. The auxiliary electrode may be disposed to face the light emitting layer ELM and include a film formed by depositing Ag, Mg, Cu, Al, Pt, Pd, Au, Ni, Nd, Ir, Cr, Li, Ca, LiF/Ca, LiF/Al, Mo, Ti or a compound or mixture thereof and transparent metal oxide disposed on the film, e.g., indium tin oxide (ITO), indium zinc oxide (IZO), zinc oxide (ZnO), or indium tin zinc oxide (ITZO).

When the organic electroluminescent device OEL is a front light emitting type organic electroluminescent device, the anode EL1 may be the reflective electrode, and the cathode EL2 may be the transmissive electrode or transflective electrode. When the organic electroluminescent device OEL is a rear light emitting type organic electroluminescent device, the anode EL1 may be the transmissive electrode or transflective electrode, the cathode EL2 may be the reflective electrode.

In the organic electroluminescent deice OEL, when a voltage may be applied to each of the anode EL1 and the cathode EL2, the hole injected from the anode EL1 may move to the light emitting layer EML via the hole transport region HTR, and the electron injected from the cathode EL2 may move to the light emitting layer EML via the electron transport region ETR. The electron and the hole may be recombined with each other in the light emitting with EML to generate exciton. Here, the exciton may drop from an excited state into the ground state to emit light.

The display panel DP provided in the foldable display device 10 according to an exemplary embodiment of the present disclosure may further include an encapsulation layer SL provided on the organic electroluminescent device OEL to seal the organic electroluminescent device OEL. The encapsulation layer SL is disposed on the cathode EL2. The encapsulation layer SL covers the cathode EL2. The encapsulation layer SL may include at least one layer of an organic layer and an inorganic layer. The encapsulation layer SL may have a single layer structure or a structure in which a plurality of layers are successively laminated. The encapsulation layer SL protects the organic electroluminescent device OEL.

Hereinafter, the touch sensing unit TSU will be described below in more detail with reference to FIGS. 3A to 7C.

Figure 3A:
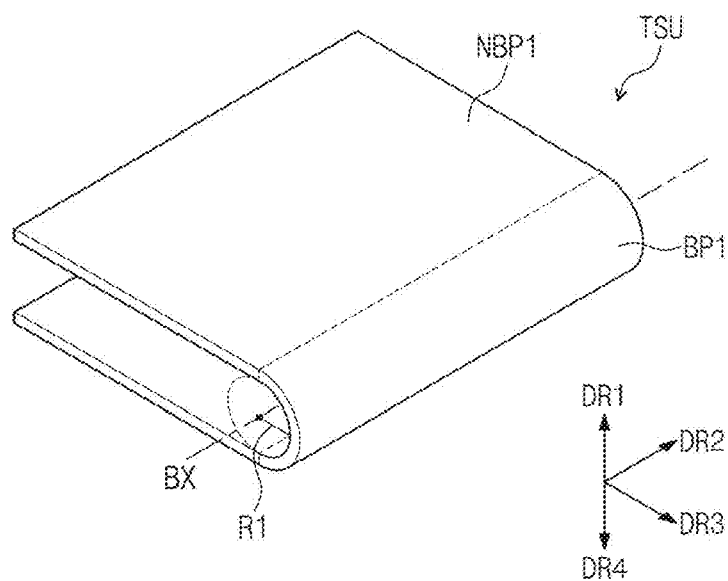
FIG. 3A and FIG. 3B are schematic perspective views of a touch sensing unit provided in the foldable display device according to an exemplary embodiment of the present disclosure.
Figure 3B:
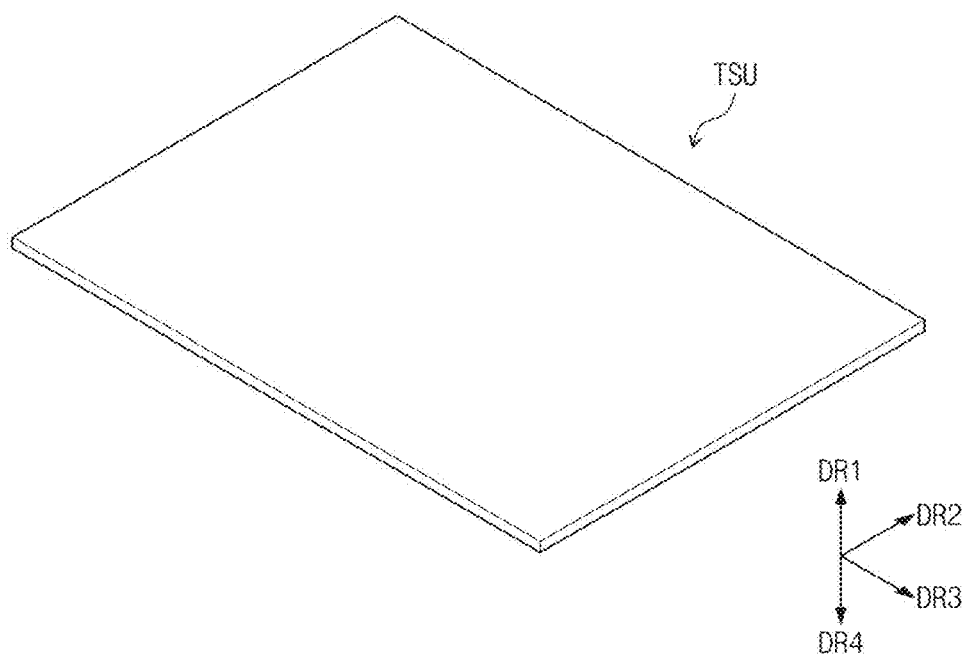

FIGS. 3A and 3B are schematic perspective views of the touch sensing unit provided in the foldable display device according to an exemplary embodiment of the present disclosure.

Referring to FIGS. 3A and 3B, as described above, the touch sensing unit TSU may be bent in one direction with respect to the bending axis BX in the first mode and be unfolded in the second mode.

Figure 4A:
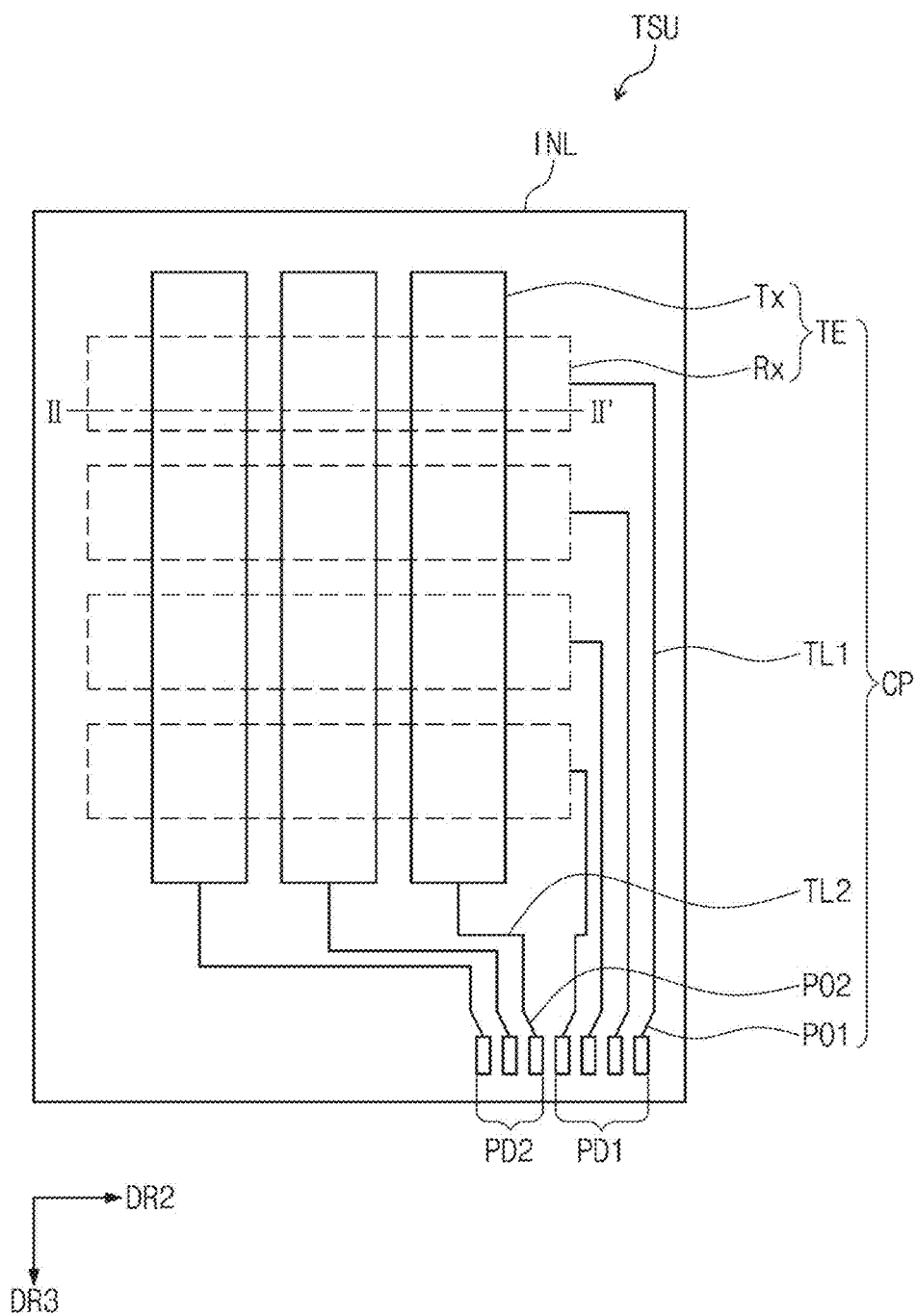
FIG. 4A is a schematic plan view of the touch sensing unit provided in the foldable display device according to an exemplary embodiment of the present disclosure.
Figure 4B:
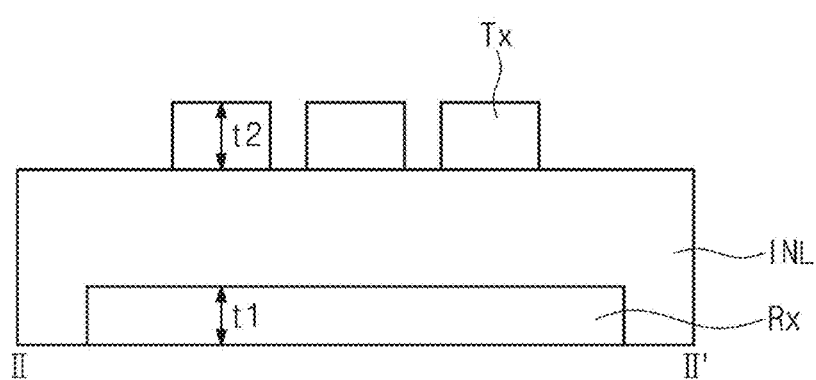
FIG. 4B is a schematic cross-sectional view taken along line II-II' of FIG. 4A.

FIG. 4A is a schematic plan view of the touch sensing unit provided in the foldable display device according to an exemplary embodiment of the present disclosure. FIG. 4B is a schematic cross-sectional view taken along line II-II' of FIG. 4A.

Figure 5A:
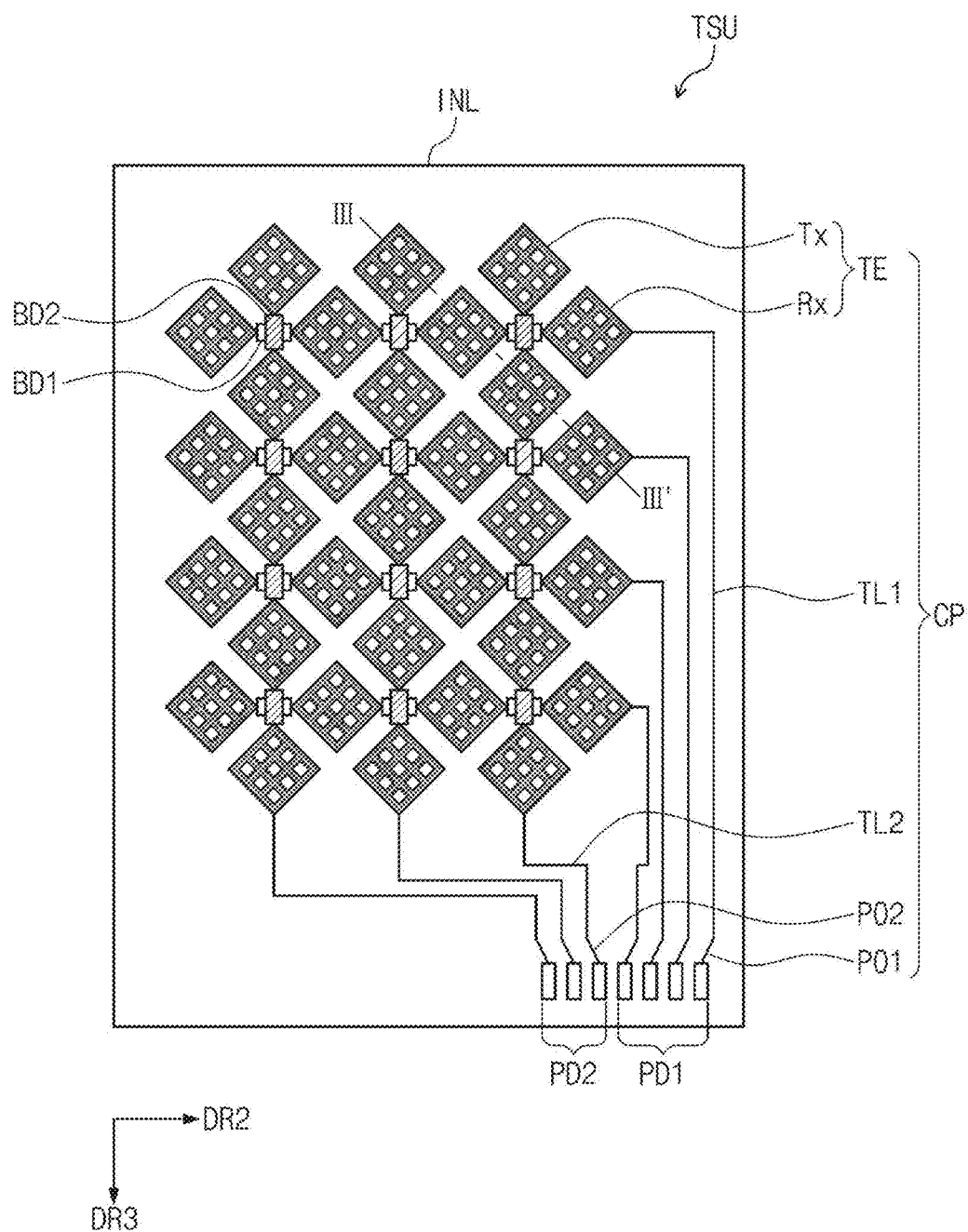
FIG. 5A is a schematic plan view of the touch sensing unit provided in the foldable display device according to an exemplary embodiment of the present disclosure.
Figure 5B:
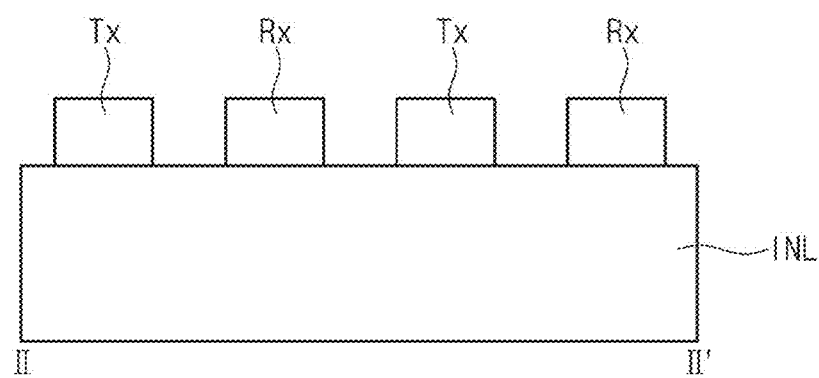
FIG. 5B is a schematic cross-sectional view taken along line III-III' of FIG. 5A.

FIG. 5A is a schematic plan view of the touch sensing unit provided in the foldable display device according to an exemplary embodiment of the present disclosure. FIG. 5B is a schematic cross-sectional view taken along line III-III' of FIG. 5A.

Referring to FIGS. 4A, 4B, 5A, and 5B, the touch sensing unit TSU includes an insulation layer INL and a plurality of sensing electrodes TE. If the insulation layer INL has been well-known in the technical fields of the present disclosure, the insulation layer INL may be employed without being limited. The insulation layer INL may include at least one of an organic layer and an inorganic layer. The insulation layer INL may include a transparent insulation material through which light is transmitted. The touch sensing unit TSU may further include connection lines TL1 and TL2, fan-out lines PO1 and PO2, and pad parts PD1 and PD2. Although not shown, the touch sensing unit TSU may further include bridges BD1 and BD2.

The sensing electrode TE includes first sensing electrodes Rx and second sensing electrodes Tx. The first sensing electrodes Rx and the second sensing electrodes Tx may be electrically insulated from each other. Each of the first sensing electrodes Rx and the second sensing electrodes Tx may have various shapes such as a diamond shape, a square shape, a rectangular shape, a circular shape, or an irregular shape (e.g., a shape in which tree branches are interlaced such as a dendrite structure). Each of the first sensing electrodes Rx and the second sensing electrodes Tx may have a structure including a plurality of holes spaced apart from each other to improve light transmittance. For example, each of the first sensing electrodes Rx and the second sensing electrodes Tx may have a mesh shape.

Each of the first sensing electrodes Rx and the second sensing electrodes Tx is not specifically limited to a material thereof if the formation materials are commonly used. For example, each of the first sensing electrodes Rx and the second sensing electrodes Tx may include at least one of metal, an alloy, or transparent conductive oxide. Each of the first sensing electrodes Rx and the second sensing electrodes Tx may include at least one of Al, Ti, Cu, Ag, Au, Pt, Mo, a silver-palladium-copper alloy (APC), a silver-palladium alloy(AP), indium tin oxide (ITO), indium zinc oxide (IZO), or indium gallium zinc oxide (IGZO). For example, each of metal and an alloy may have various shapes such as a globular shape and a wire shape.

When direct touch or indirect touch occurs, for example, capacitance may vary between the first sensing electrodes Rx and the second sensing electrodes Tx provided in the sensing electrode TE. Since the capacitance varies, a sensing signal applied to the second sensing electrodes Tx may be delayed and provided to the first sensing electrodes Rx. The touch sensing unit TSU may sense touch coordinates from the delayed value of the sensing signal.

Although the touch sensing unit TSU is driven in a capacitive type in an exemplary embodiment of the present disclosure, exemplary embodiments of the present disclosure are not limited thereto. For example, the touch sensing unit TSU may be driven in a resistive touch screen type. Also, the touch sensing unit TSU may be driven in one type of a self capacitive type manner and a mutual capacitive type.

Referring to FIGS. 4A and 4B, the first sensing electrodes Rx and the second sending electrodes Tx may be disposed on layers different from each other. For example, the first sensing electrodes Rx may extend in the second direction and be spaced apart from each other in the third direction DR2. The first sensing electrodes Rx is disposed below the insulation layer INL. Each of side surfaces of the first sensing electrodes Rx may not be exposed by the insulation layer INL. The first sensing electrodes Rx are covered by the insulation layer INL.

For example, the second sensing electrode Tx may extend in the third direction DR3 and be spaced apart from each other in the second direction DR2. The second sensing electrodes Tx are disposed on the first sensing electrodes Rx. The second sensing electrodes Tx are disposed on the insulation layer INL.

Referring to FIGS. 5A and 5B, the first sensing electrodes Rx and the second sensing electrodes Tx may be disposed on the same layer. Each of the first sensing electrodes Rx and the second sensing electrodes Tx may be disposed on the insulation layer INL. The first sensing electrodes Rx and the second sensing electrodes Tx may be spaced apart from each other on a plane.

In this specification, the term "on the plane" may mean when the foldable display device 10 according to an exemplary embodiment of the present disclosure is viewed in a thickness direction (e.g., the direction DR2 of FIG. 1).

The first sensing electrodes Rx may be disposed to be spaced apart from each other in the second direction DR2 and the third direction DR3. The first sensing electrodes Rx spaced apart from each other in the second direction are connected to each other by the first bridge BD1. The second sensing electrodes Tx may be disposed to be spaced apart from each other in the second direction DR2 and the third direction DR3. The second sensing electrodes Tx spaced apart from each other in the third direction are connected to each other by the second bridge BD2. The second bridge BD2 may be disposed on the first bridge BD1. Although not shown, the insulation layer INL may be disposed between the second bridge BD2 and the first bridge BD1.

Referring again to FIGS. 4A, 4B, 5A, and 5B, the connection lines TL1 and TL2 are electrically connected to the sensing electrode TE. The connection lines TL1 and TL2 include first connection lines TL1 and second connection lines TL2. The first connection lines TL1 may be connected to the first sensing electrodes Rx and the first fan-out lines PO1. The second connection lines TL2 may be connected to the second sensing electrodes Tx and the second fan-out lines PO2.

The fan-out lines PO1 and PO2 are connected to the connection lines TL1 and TL2 and the pad parts PD1 and PD2. The fan-out lines PO1 and PO2 include first fan-out lines PO1 and second fan-out lines PO2. The first fan-out lines PO1 are connected to the first connection lines TL1 and the first pad part PD1. The second fan-out lines PO2 are connected to the second connection lines TL2 and the second pad part PD2.

The pad parts PD1 and PD2 are electrically connected to the sensing electrode TE. The pad parts PD1 and PD2 include the first pad part PD1 and the second pad part PD2. The first pad part PD1 is connected to the first fan-out lines PO1. The first pad part PD1 may be electrically connected to the first sensing electrodes Rx. The second pad part PD2 is connected to the second fan-out lines PO2. The second pad part PD2 may be electrically connected to the second sensing electrodes Tx.

Figure 6A:
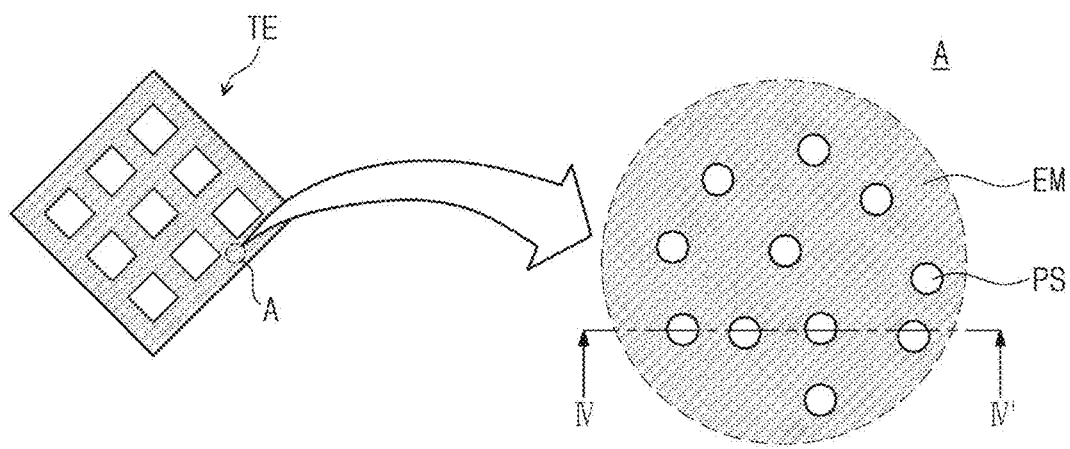
FIG. 6A is a plan view of one of sensing electrodes of FIG. 5A.
Figure 6B:
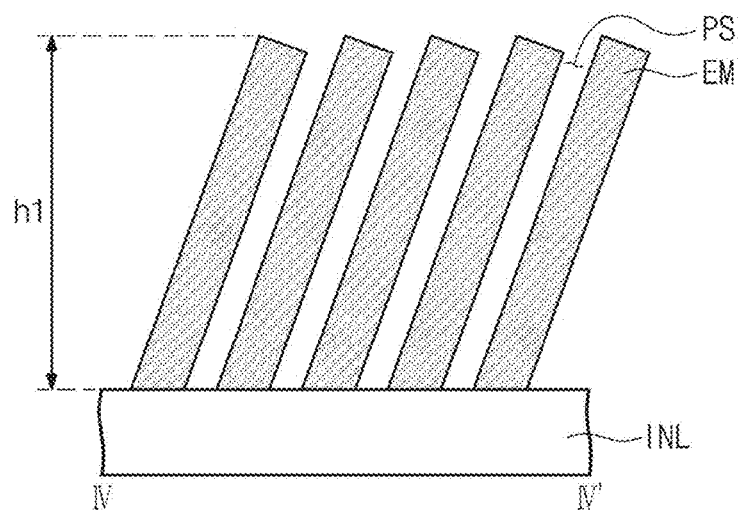
FIG. 6B and FIG. 6C are schematic cross-sectional views taken along line IV-IV' of a portion A of FIG. 6A.
Figure 6C:
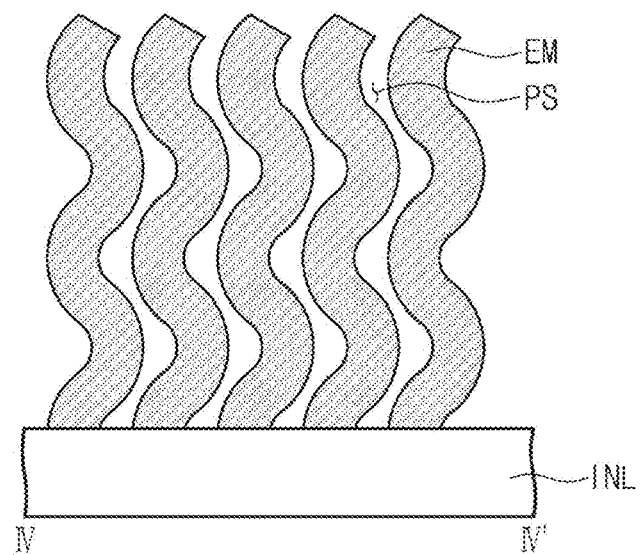

FIG. 6A is a plan view of one of sensing electrodes of FIG. 5A. FIGS. 6B and 6C are schematic cross-sectional views taken along line IV-IV' of a portion A of FIG. 6A.

Referring to FIGS. 6A to 6C, each of the plurality of sensing electrodes TE may have a porous structure. Each of the plurality of sensing electrodes is made of a conductive material and has a porous structure. As described above, each of the plurality of sensing electrodes TE may have a structure including a plurality of holes spaced apart from each other to improve light transmittance. In this case, each of the plurality of sensing electrodes TE may be made of a conductive material in a region except for the holes, and a shape in which the conductive material is provided may have a porous structure.

The porous structure may mean a structure include a plurality of pores, for example, a structure including a plurality of pores, each of which has a mean diameter of about 10 nm to about 30 nm. Particularly, the porous structure may mean a structure including a plurality of pores, each of which has a mean diameter of about 15 nm to about 25 nm. Although exemplary embodiments of the present disclosure are not limited thereto, the mean diameter may be about 19 nm.

In the related art, when the foldable display device is bent in a state in which the sensing electrodes that are metal thin films including Al do not have sufficient flexibility, cracks may occur. The cracks occurring when bent may be propagated to cause defects of the foldable display device. Particularly, it is necessary to solve the limitation of the crack occurrence of the sensing electrodes so as to realize the foldable display device having superior durability and a low curvature.

To provide the sensing electrodes to sufficient flexibility, although a technology in which metal such as Al and the like is replaced with silver nano wire grid (AgNW) has been being proposed, it may be difficult to fabricate the silver nano wire grid, and the silver nano wire grid may be expensive.

Each of the sensing electrodes TE of the foldable display device 10 according to an exemplary embodiment of the present disclosure has a porous structure. The flexibility may be sufficiently secured due to pores PS that are an air layer within the porous structure. As a result, even though the foldable display device 10 is bent (operates in the first mode), the occurrence of the cracks within the sensing electrodes TE may be minimized. Also, since metals such as Al are used as a material of the sensing electrodes TE, it is advantageous in economic feasibility and process easiness when compared to the silver nano wire grid replacement technique.

At least a portion of the sensing electrodes TE is included in a bent touch portion (e.g., reference symbol BP1 of FIG. 3A). The foldable display device 10 according to an exemplary embodiment of the present disclosure may operate in the first mode in which at least a portion of the sensing electrodes TE is bent and a second mode in which the bent portion is unfolded.

Referring to FIG. 6A, each of the plurality of sensing electrodes TE may include a porous structure that is a structure including a plurality of pores PS. The pores PS may correspond to a region in which the conductive material EM is not provided within each of the sensing electrodes TE.

Referring to FIGS. 6B and 6C, the porous structure may include a plurality of protrusions of the conductive material EM, which at least portions are spaced apart from each other. Each of the protrusions may include the conductive material EM. At least portions of the plurality of protrusions of conductive material EM may be spaced apart from each other on the insulation layer INL. The protrusions of conductive material EM may be spaced apart from each other to form a space PS therebetween, thereby forming the porous structure. Although the protrusions of conductive material EM are completely spaced apart from each other in FIGS. 6B and 6C, exemplary embodiments of the present disclosure are not limited thereto. For example, at least portions of two protrusions of conductive material EM adjacent to each other may contact each other. The space PS between the protrusions of conductive material EM spaced apart from each other may be a closed type in which the space PS is surrounded by the conductive material EM or be an open type in which a portion of the space PS is not surrounded by the conductive material EM. Alternatively, the spaced PS may be a mixed type of the closed type and the open type.

Referring again to FIG. 4B, each of the sensing electrodes TE may have a thickness ranging from about 40 nm to about 60 nm. Each of the first sensing electrodes Rx may have a thickness t1 ranging from about 40 nm to about 60 nm. Each of the second sensing electrodes Tx may have a thickness t2 ranging from about 40 nm to about 60 nm. Each of the protrusions EM may have a mean height ranging from about 40 nm to about 60 nm. The mean height of the protrusions EM may be defined as a mean value of the heights (e.g., reference symbol h1 of FIG. 6B) of the protrusions EM.

Referring to FIG. 6B, the porous structure may include a plurality of inclined protrusions EM extending at an acute angle from a base layer. For example, each of the protrusions EM may be disposed to be inclined at an acute angle on the insulation layer INL.

Referring to FIG. 6C, the porous structure may include a plurality of spiral protrusions of conductive material EM. For example, each of the protrusions of conductive material EM may be disposed on the insulation layer INL.

Each of the sensing electrodes TE may satisfy following Equation 1:

$$0.2 \leq V_C/V_T \leq 0.6 \qquad \text{(Equation 1)}$$

where, in Equation 1, reference symbol $V_C$ represents a volume of the conductive material EM within each of the sensing electrodes TE, and reference symbol $V_T$ represents the total volume of each of the sensing electrodes TE.

Particularly, reference symbol $V_C$ represents the sum of volumes of the protrusions EM, and reference symbol $V_T$ represents the sum of volumes of $V_C$ and the pores PS. More particularly, reference symbol $V_C$ represents the sum of volumes of the plurality of protrusions EM of which at least portions are spaced apart from each other, and reference symbol $V_T$ represents the sum of volumes PS of spaces defined by the protrusions of conductive material EM spaced apart from each other.

Reference symbol $V_C/V_T$ may be a value representing a degree of density of the conductive material EM within each of the sensing electrodes TE. Here, the more the value approaches 1, the more the porous structure is dense.

When the value of $V_C/V_T$ exceeds about 0.6, since the pores PS that are the air layers within the porous structure are not sufficient, an effect in reducing the occurrence of the cracks may be incomplete. When the value of $V_C/V_T$ is less than about 0.2, since the pores PS that are the air layers within the porous structure are too many, light provided from the organic electroluminescent device OEL is refracted within the pores PS, each of the sensing electrodes TE may be deteriorated in light transmittance.

For example, the light transmittance may range from about 80% to about 95%. When the light transmittance is less than about 80%, the sensing electrode TE may not be suitable for an electrode for the display device. When the light transmittance is greater than about 90%, an actual realization in process may not be easy. However, exemplary embodiments of the present disclosure are not limited thereto.

Figure 7A:
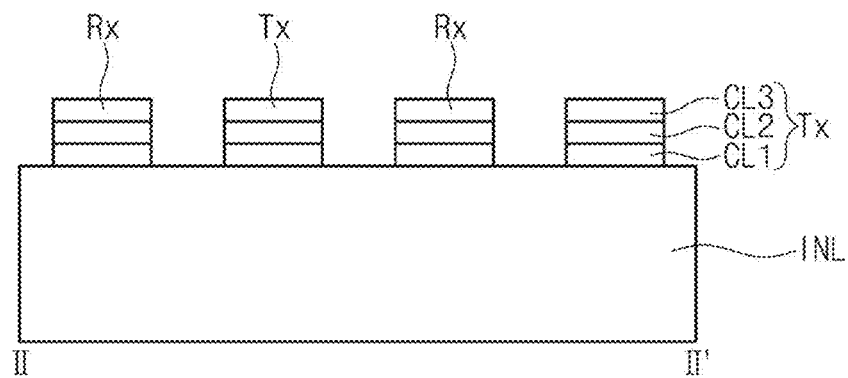
FIG. 7A is a schematic cross-sectional view taken along line III-III' of FIG. 5A.
Figure 7B:
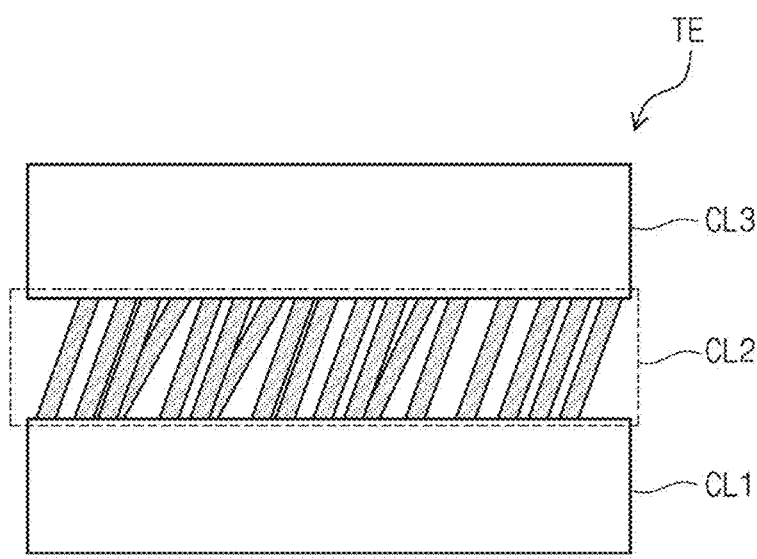
FIG. 7B and FIG. 7C are detailed cross-sectional views of one of the sensing electrodes of FIG. 7A.
Figure 7C:
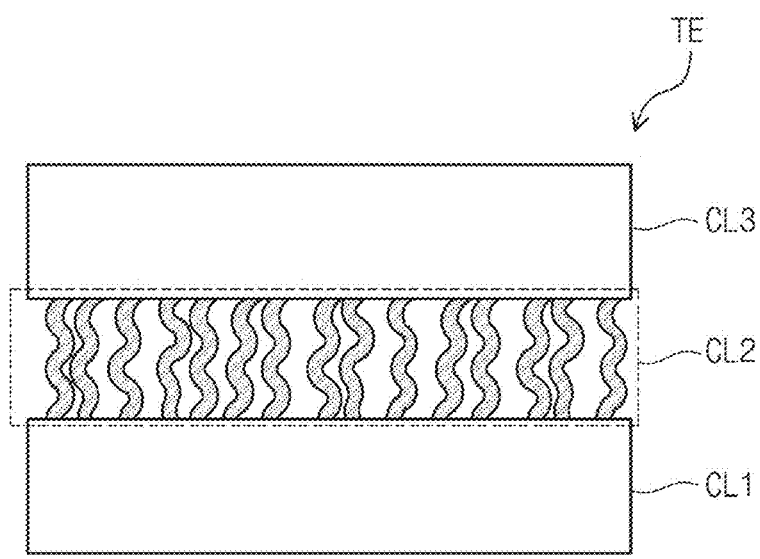

FIG. 7A is a schematic cross-sectional view taken along line III-III' of FIG. 5A. FIGS. 7B and 7C are detailed cross-sectional views of one of the sensing electrodes of FIG. 7A.

Referring to FIG. 7A, each of the sensing electrodes TE may have a structure in which a plurality of layers are laminated. However, exemplary embodiments of the present disclosure are not limited thereto. For example, each of the sensing electrodes TE may include a first conductive layer CL1 including a first conductive material, a second conductive layer CL2 including a second conductive material, and a third conductive layer CL3 including a third conductive material. The second conductive layer CL2 may be disposed on the first conductive layer CL1, and the third conductive layer CL3 may be disposed on the second conductive layer CL2.

Although the first conductive layer CL1, the second conductive layer CL2, and the third conductive layer CL3 have the same thickness in FIG. 7A, exemplary embodiments of the present disclosure are not limited thereto. For example, the second conductive layer CL2 may have a thickness greater than that of each of the first conductive layer CL1 and the third conductive layer CL3.

Referring to FIGS. 7B and 7C, the second conductive layer CL2 may have a porous structure. Each of the first and third conductive layers CL1 and CL3 may not have the porous structure.

Each of the first, second, and third conductive materials may include at least one of Al, Ti, Cu, Ag, Au, Pt, Mo, a silver-palladium-copper alloy (APC), a silver-palladium alloy(AP), indium tin oxide (ITO), indium zinc oxide (IZO), or indium gallium zinc oxide (IGZO). For example, each of the first and third conductive materials may include Ti, and the second conductive material may include Al. Each of the first and third conductive layers CL1 and CL3 may be made of Ti, and the second conductive layer CL2 may be made of Al.

Figure 8A:
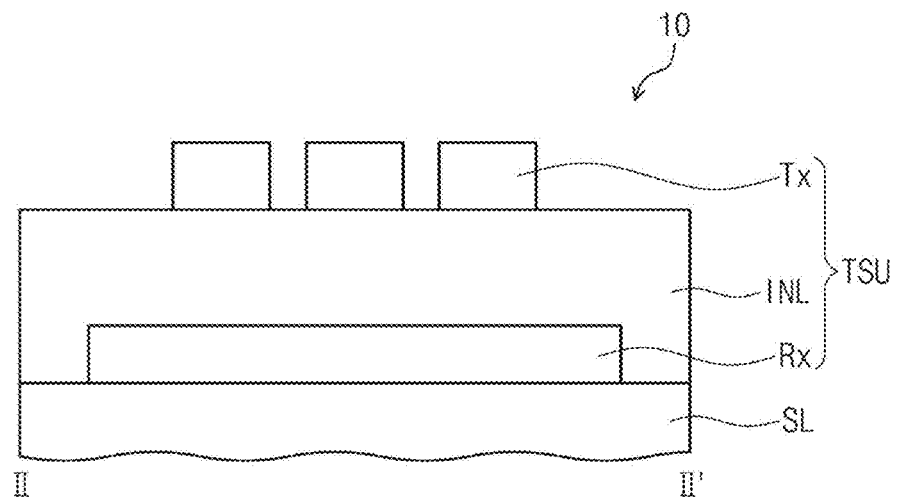
FIG. 8A and FIG. 8B are schematic cross-sectional view of the foldable display device according to an exemplary embodiment of the present disclosure.
Figure 8B:
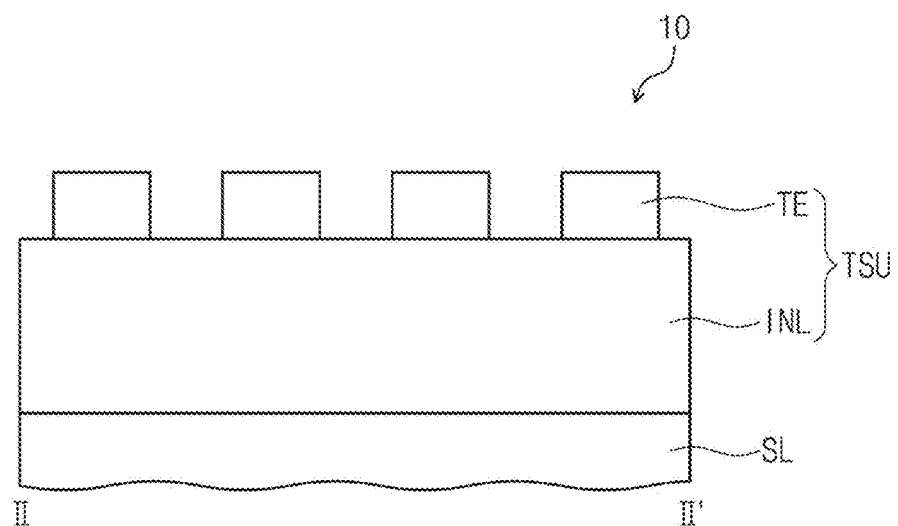

FIGS. 8A and 8B are schematic cross-sectional view of the foldable display device according to an exemplary embodiment of the present disclosure.

Referring to FIGS. 8A and 8B, the touch sensing unit TSU may be disposed on the encapsulation layer SL. The touch sensing unit TSU the encapsulation layer SL may contact each other. However, exemplary embodiments of the present disclosure are not limited thereto. For example, a separate layer such as an adhesion layer may be disposed between the touch sensing unit TSU and the encapsulation layer SL.

Referring to FIG. 8A, the first sensing electrodes Rx may be disposed on the encapsulation layer SL to contact the encapsulation layer SL. The insulation layer INL may be disposed on the encapsulation layer SL and the first sensing electrodes Rx to contact each of the encapsulation layer SL and the first sensing electrodes Rx.

Referring to FIG. 8B, the insulation layer INL may be disposed on the encapsulation layer SL to contact the encapsulation layer SL. Each of the first and second sensing electrodes Rx and Tx may contact the insulation layer INL.

Figure 9:
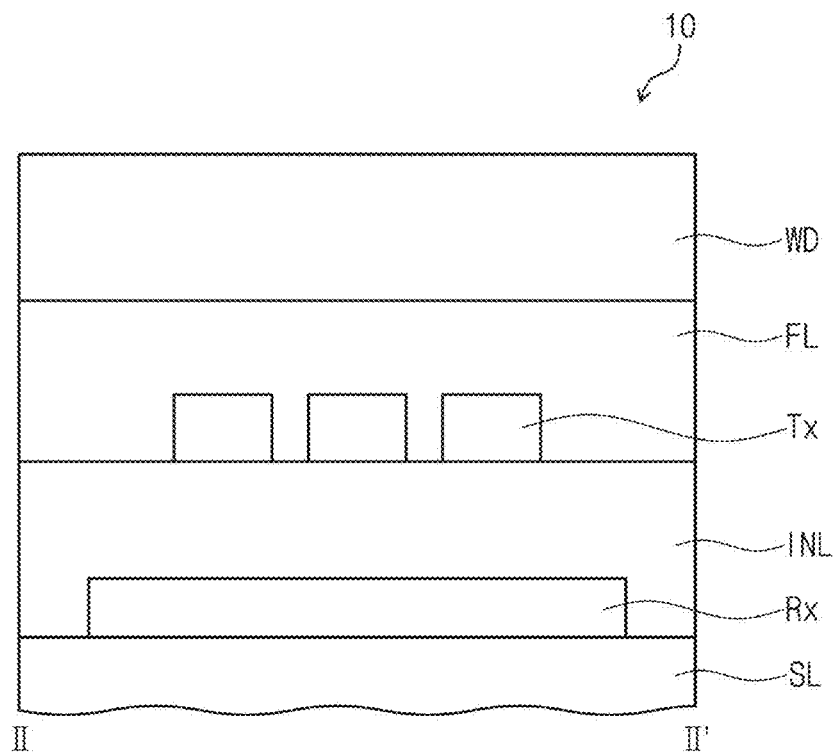
FIG. 9 is a schematic cross-sectional view of the foldable display device according to an exemplary embodiment of the present disclosure.

FIG. 9 is a schematic cross-sectional view of the foldable display device according to an exemplary embodiment of the present disclosure.

Referring to FIG. 9, the foldable display device 10 according to an exemplary embodiment of the present disclosure may further include a planarization layer FL and a window WD. The planarization layer FL may be transparent. The planarization layer FL is disposed on the sensing electrodes TE and the insulation layer INL. The planarization layer FL covers the sensing electrodes TE. The window WD may be disposed on the planarization layer FL.

Each of the sensing electrodes TE provided in the foldable display device 10 according to an exemplary embodiment of the present disclosure may include the conductive material EM and have the porous structure. Also, each of the sensing electrodes TE may have an optical anisotropy due to the porous structure. In more detail, light emitted from the organic electroluminescent device OEL may be polarized while passing through the sensing electrodes TE. That is, the sensing electrodes TE may also perform the polarizing layer at the same time. As a result, the foldable display device 10 according to an exemplary embodiment of the present disclosure may not require a separate polarizing layer. That is, the foldable display device 10 according to an exemplary embodiment of the present disclosure may not provide a separate polarizing layer between the touch sensing unit TSU and the window WD. Since the polarizing layer separately provided on the touch sensing unit TSU is omitted, the thinner display device may be realized.

Hereinafter, a method for fabricating the foldable display device according to an exemplary embodiment of the present disclosure will be described. Hereinafter, different points with respect to the foldable display device according to the foregoing exemplary embodiment of the present disclosure will be mainly described, and thus, non-explained portions will be quoted from the foldable display device according to the foregoing exemplary embodiment of the present disclosure.

Figure 10:
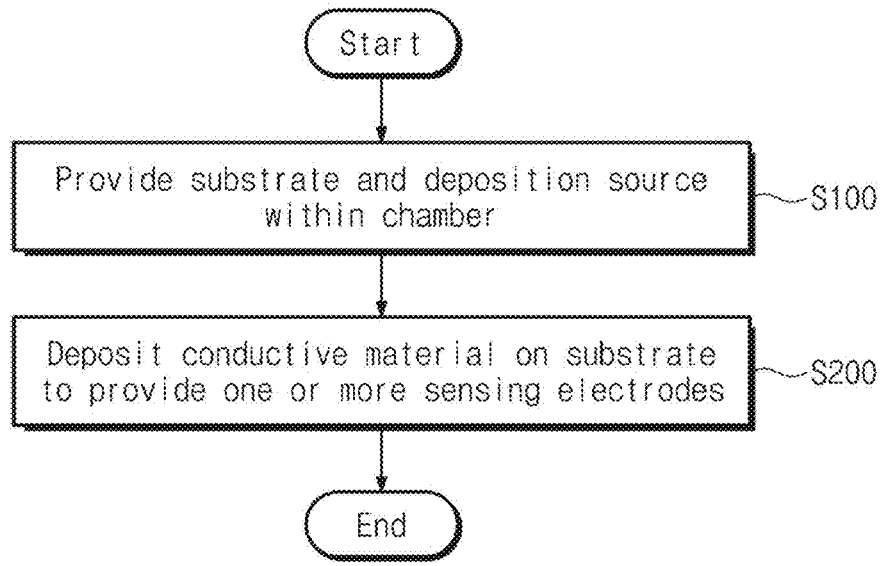
FIG. 10 is a schematic flowchart illustrating a method for the foldable display device according to an exemplary embodiment of the present disclosure.
Figure 11:
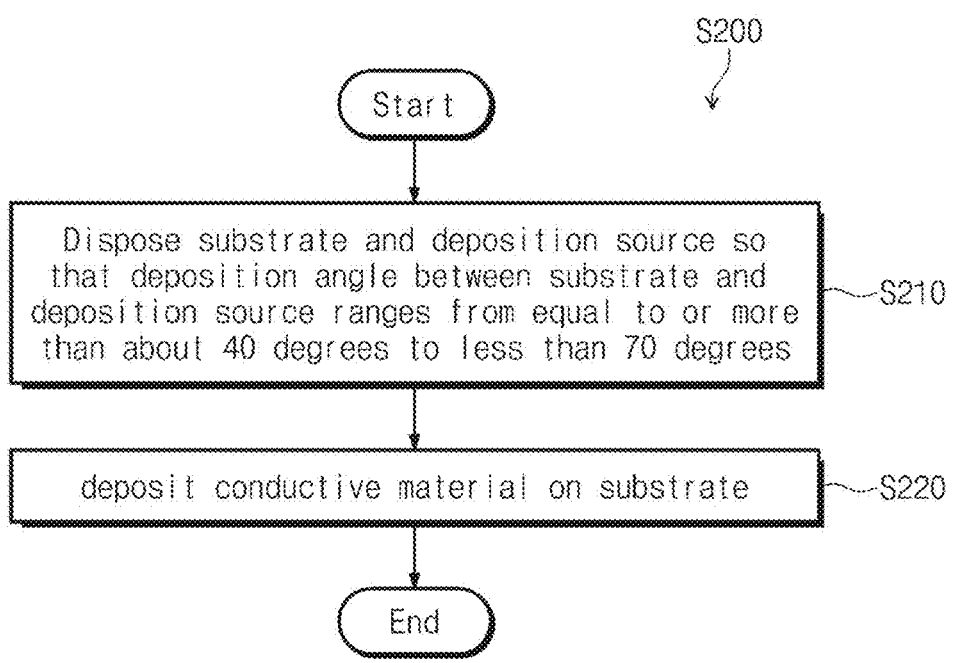
FIG. 11 is a schematic flowchart illustrating a method for the foldable display device according to an exemplary embodiment of the present disclosure.
Figure 12A:
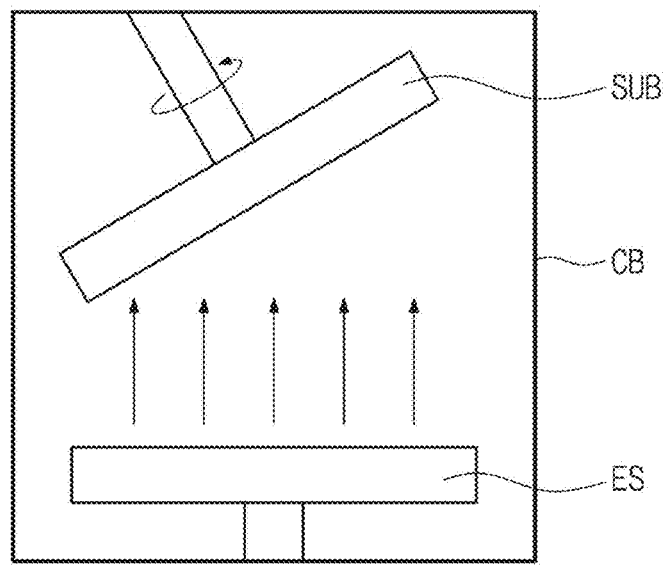
FIG. 12A and FIG. 12B are schematic views illustrating positions of a substrate and a deposition source within a chamber for depositing a conductive material on the substrate.
Figure 12B:
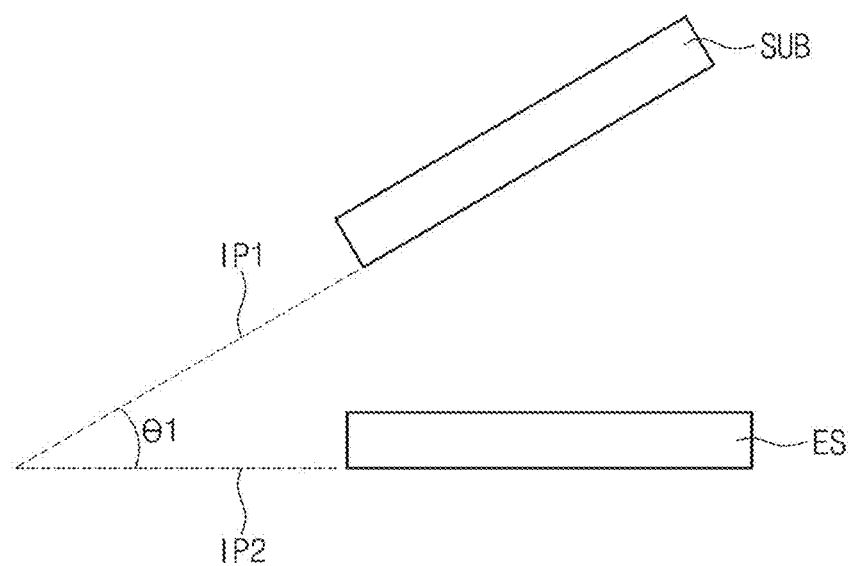

FIG. 10 is a schematic flowchart illustrating a method for the foldable display device according to an exemplary embodiment of the present disclosure. FIG. 11 is a schematic flowchart illustrating a method for the foldable display device according to an exemplary embodiment of the present disclosure. FIGS. 12A and 12B are schematic views illustrating positions of a substrate and a deposition source within a chamber for depositing a conductive material EM on the substrate.

Referring to FIGS. 4B, 5B, 6B, 10, 12A, and 12B, a method for fabricating the foldable display device according to an exemplary embodiment of the present disclosure includes a process (S100) of providing a substrate SUB and a deposition source ES within a chamber CB and a process (S200) of depositing a conductive material EM on the substrate SUB to provide one or more sensing electrodes TE.

Referring to FIGS. 6A and 11, the process (S200) of providing the sensing electrodes TE on the substrate SUB includes a process (S210) of disposing the substrate SUB and the deposition source ES so that the substrate SUB and the deposition source ES are angled at an angle of equal to or more than about 40 degrees to less than about 70 degrees and a process (S220) of depositing the conductive material EM on the substrate SUB.

Referring to FIGS. 12A and 12B, the substrate SUB and the deposition source ES within the chamber CB may not be parallel to each other. Particularly, the substrate SUB and the deposition source ES within the chamber CB may be disposed at a deposition angle $\theta 1$ of equal to or more than about 40 degrees to less than about 70 degrees. The deposition process (S220) may be performed while maintaining the deposition angle $\theta 1$. The deposition angle $\theta 1$ between the substrate SUB and the deposition source ES may be defined as an angle $\theta 1$ between a virtual first plane IP1 and a virtual second plane IP2 on a tangent at which the virtual first plane IP1 extending from the substrate SUB and the virtual second plane IP2 extending from the deposition source ES meet each other.

According to the related art, the substrate and the deposition source within the chamber may be disposed parallel to each other, and the conductive material may be deposited on the substrate to form the sensing electrodes. When the deposition is performed in the state in which the substrate and the deposition source are disposed parallel to each other, the sensing electrodes each of which has a dense structure may be provided on the substrate. Here, the dense structure may mean a shape which has little pores in the insides of the sensing electrodes except for surfaces of the sensing electrodes.

In the method for fabricating the foldable display device according to an exemplary embodiment of the present disclosure, the substrate SUB and the deposition source ES within the chamber CB are disposed at the deposition angle $\theta 1$ of equal to or more than about 40 degrees to less than about 70 degrees to perform the deposition process (S220). Thus, each of the sensing electrodes TE provided on the substrate SUB may have a porous structure. Each of the sensing electrodes TE may increase in flexibility due to the porous structure. As a result, when the foldable display device is bent, an occurrence of cracks within the sensing electrodes TE may be prevented or minimized. Referring to FIGS. 6A to 6C, in the method for fabricating the foldable display device according to an exemplary embodiment of the present disclosure, at least a portion of the sensing electrodes TE may have the porous structure including a plurality of protrusions spaced apart from each other. Also, the sensing electrode TE may be a closed type in which pores within the porous structure are surrounded by the conductive material EM, an open type in which a portion of the porous is not surrounded by the conductive material EM, or a mixed type of the closed type and the open type.

When the deposition angle $\theta 1$ is less than about 40 degrees, each of the sensing electrodes TE provided on the substrate SUB may not have the porous structure, but have a sense structure which has little pores. As a result, when the foldable display device 10 is bent, an effect for preventing or minimizing the occurrence of the cracks within the sensing electrodes TE may be incomplete.

Figure 13A:
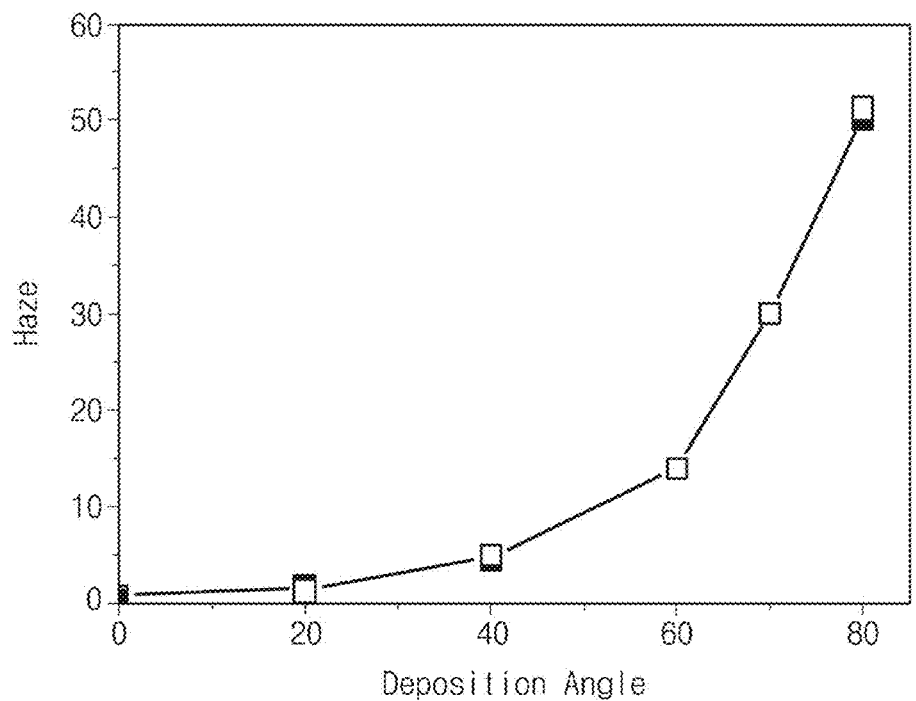
FIG. 13A is a graph illustrating a haze value of the sensing electrode depending on a deposition angle.
Figure 13B:
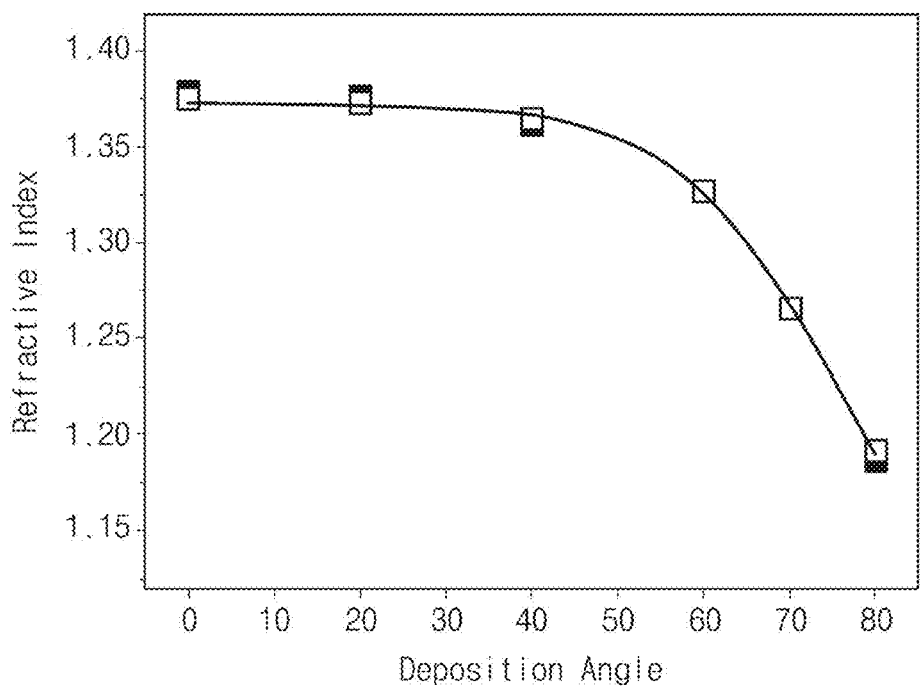
FIG. 13B is a graph illustrating a refractive index value of the sensing electrode depending on the deposition angle.

FIG. 13A is a graph illustrating a haze value of the sensing electrode depending on the deposition angle. FIG. 13B is a graph illustrating a refractive index of the sensing electrode depending on the deposition angle.

Referring to FIGS. 6B, 6C, and 13A, when the deposition angle $\theta 1$ is equal to or greater than about 70 degrees, a proportion occupied by the pores PS within the porous structure having the conductive material EM in each of the sensing electrodes TE may be excessively high to increase a haze value of each of the sensing electrodes TE. The increase of the haze value of each of the sensing electrodes TE may mean a case in which light transmittance is reduced.

When the light transmittance of the sensing electrodes TE is reduced, the sensing electrodes TE may not be suitable for the display device.

Referring to FIG. 13b, when the deposition angle θ1 is equal to or greater than about 70 degrees, it is seen that each of the sensing electrodes TE is significantly reduced in refractive index. The reduction in refractive index of each of the sensing electrodes TE may mean a case in which electrical conductivity is reduced. As a result, the sensing electrodes TE may not be suitable for the display device.

The deposition process (S220) may be performed while maintaining the inside of the chamber CB in a vacuum state.

The deposition process (S200) may be a process which is performed while the substrate SUB rotates in a state in which the deposition angle θ1 is maintained to an angle of about equal to or more than 40 degrees to less than about 70 degrees. Referring to FIG. 6C, when the deposition process (S220) is performed while the substrate SUB rotates, the porous structure including the plurality of protrudes EM having a spiral shape may be formed. In this case, a rotation rate of the substrate may range from about 0.2 rpm to about 1 rpm, but is not limited thereto. When the rotation rate of the substrate exceeds about 1 rpm, the porous structure may not be formed, but the sense structure in which the empty space is filled may be formed.

However, exemplary embodiments of the present disclosure are not limited thereto. For example, the deposition process (S220) may be a process in which the substrate that is in a stop state is performed in the state in which the deposition angle θ1 is maintained to an angle of equal to or more than about 40 degrees to less than about 70 degrees. Referring to FIG. 6B, when the deposition process (S220) is performed while the substrate SUB is stopped, the porous structure including the plurality of protrudes EM, which are inclined on the substrate SUB, may be formed.

The deposition process (S220) may be a process of depositing a conductive material including at least one of Al, Ti, Cu, Ag, Au, Pt, Mo, a silver-palladium-copper alloy (APC), a silver-palladium alloy(AP), indium tin oxide (ITO), indium zinc oxide (IZO), or indium gallium zinc oxide (IGZO).

The deposition process (S220) may be performed by adopting a general deposition method that is well-known by the skilled in the art. For example, the deposition process (S220) may be performed in a thermal evaporation manner or a physical vapor deposition (PVD) manner such as sputtering.

The process (S200) of providing the sensing electrodes TE on the substrate SUB may be a process of depositing the conductive material EM to a thickness of about 40 nm to about 60 nm on the substrate SUB. In more detail, the process (S200) may be a process of providing the sensing electrodes TE having the porous structure including the plurality of protrudes of which at least portions are spaced apart from each other. Here, the process (S200) may be a process in which deposition is performed so that the protrusions have a mean thickness ranging from about 40 nm to about 60 nm.

The process (S200) of providing the sensing electrodes TE on the substrate SUB may be a process of depositing the conductive material EM so that the abovementioned Equation 1 is satisfied.

Figure 14:
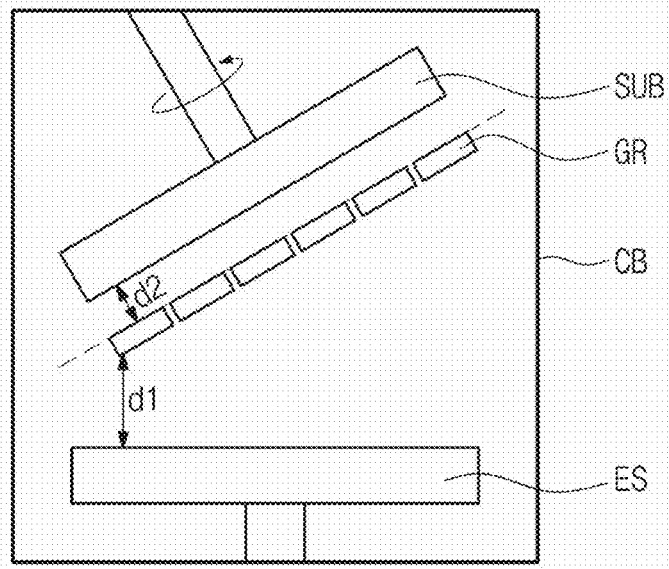
FIG. 14 is a schematic view illustrating positions of the substrate, the deposition source, and a grid layer within the chamber for depositing the conductive material on the substrate.

FIG. 14 is a schematic view illustrating positions of the substrate, the deposition source, and a grid layer within the chamber for depositing the conductive material on the substrate.

Referring to FIG. 14, the method for fabricating the foldable display device according to an exemplary embodiment of the present disclosure may further include a process of disposing a grid layer GR between the substrate SUB and the deposition source ES within the chamber CB in a direction parallel to the substrate SUB before the process (S200) of providing the sensing electrodes TE on the substrate SUB.

Since the grid layer having a net shape or a mesh shape is additionally provided in the chamber, the porous structure may be more easily formed. To effectively realize the above-described effect, the grid layer GP had to be disposed more adjacent to the substrate SUB than the deposition source ES. In more detail, the shortest distance d1 between the grid layer GR and the deposition source ES may be greater than a distance d2 between the grid layer GR and the substrate SUB. When the grid layer GR is disposed more adjacent to the deposition source ES than the substrate SUB, the effect for easily forming the porous structure may be incomplete.

The method for fabricating the foldable display device according to an exemplary embodiment of the present disclosure may further include a process of preparing a substrate before the process (S100) of providing the substrate SUB and the deposition source ES within the chamber CB.

Referring to FIG. 2C, the process of preparing the substrate SUB may include a process of preparing a base substrate BS including at least one of polyethylene terephthalate (PET), polyethylene naphthalate (PEN), polyimide, or polyether sulfone, a process of providing a thin film transistor TFT2 on the base substrate BS, and a process of providing an organic electroluminescent device OEL connected to the thin film transistor TFT2. Each of the process of preparing the base substrate BS, the process of providing the thin film transistor TFT2, and the process of providing the organic electroluminescent device OEL may be performed by adopting a general cooling method that is well known to a person skilled in the art. Although not shown, the substrate SUB may include a bent portion and a non-bent portion.

Referring to FIG. 7A, the process of preparing the substrate SUB may further include a process of depositing a first conductive material on the organic electroluminescent device OEL to provide the first conductive layer. The deposition of the first conductive material may be performed in a state in which the substrate and the deposition source are disposed parallel to each other. Particularly, after the process of providing the first conductive layer, the process of (S210) of disposing the substrate SUB and the deposition source ES so that the substrate SUB and the deposition source ES are angled at an angle of equal to or more than about 40 degrees to less than about 70 degrees and the process (S220) of depositing the conductive material EM on the substrate SUB to provide the second conductive layer may be performed. As necessary, after the process (S220) of providing the second conductive layer, the substrate and the deposition source may be disposed again parallel to each other, and then, a process of providing a third conductive layer by using a third conductive material may be performed.

Figure 15:
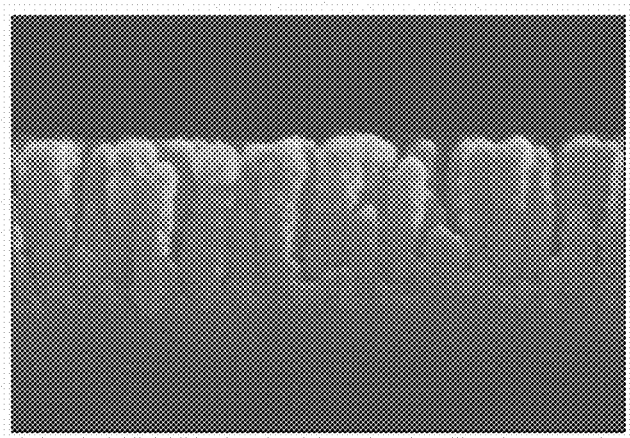
FIG. 15 is a view illustrating an image obtained by photographing a cross-section the sensing electrode fabricated according to the method for fabricating the foldable display device by using a scanning electron microscope (SEM) according to an exemplary embodiment of the present disclosure.

FIG. 15 is a view illustrating an image obtained by photographing a cross-section the sensing electrode fabricated according to the method for fabricating the foldable display device by using a scanning electron microscope (SEM) according to an exemplary embodiment of the present disclosure.

Referring to FIG. 15, in the method for fabricating the foldable display device according to the exemplary embodiment of the present disclosure, the sensing electrodes each of which has the porous structure may be fabricated. Since each of the sensing electrodes has the porous structure, the sensing electrodes may have the flexibility. Thus, when the foldable display device is bent, the occurrence of the cracks within the sensing electrodes may be minimized.

Also, since each of the sensing electrodes has the porous structure, each of the sensing electrodes may have an optical anisotropy. Thus, the sensing electrodes may perform the polarizing function at the same time. That is, in the method for fabricating the foldable display device according to the exemplary embodiment of the present disclosure, it is unnecessary to provide the process of providing the separate polarizing layer beyond the process of providing the sensing electrodes.

In the foldable display device according to the exemplary embodiment of the present disclosure, the occurrence of the cracks when being bent may be minimized.

The foldable display device according to the exemplary embodiment of the present disclosure may include the sensing electrodes that are capable of performing the polarizing function at the same time, and thus, a separate polarizing plate may be unnecessary. As a result, the foldable display device may be thinner and reduced in material cost.

In the method for fabricating the foldable display device according to the exemplary embodiment of the present disclosure, the foldable display device in which the occurrence of the cracks within the sensing electrodes when being bent is reduced may be provided.

In the method for fabricating the foldable display device according to the exemplary embodiment of the present disclosure, the foldable display device does not require fabrication of a separate polarizing plate beyond the fabrication of the sensing electrodes.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A foldable display device comprising:
   a display panel comprising a bent display portion and a non-bent display portion; and
   a touch sensing unit provided on the display panel and comprising a bent touch portion and a non-bent touch portion,
   wherein:
   the touch sensing unit comprises a plurality of sensing electrodes; and
   each of the sensing electrodes comprises:
   a first conductive layer comprising a first conductive material;
   a second conductive layer disposed on the first conductive layer and comprising a second conductive material; and
   a third conductive layer disposed on the second conductive layer and comprising a third conductive material,
   the second conductive layer comprises a plurality of protrusions of which at least portions are spaced apart from each other, and an air layer defined between adjacent protrusions,
   the plurality of protrusions consist of a plurality of inclined protrusions of the second conductive material extending at an acute angle from a base layer or a plurality of spiral protrusions of the second conductive material extending from the base layer, and
   the second conductive layer and the third conductive layer contact each other.

2. The foldable display device of claim 1, wherein the protrusions have a mean height ranging from about 40 nm to about 60 nm.

3. The foldable display device of claim 1, wherein each of the sensing electrodes satisfies Equation 1:

$$0.2 \leq V_C/V_T \leq 0.6 \qquad \text{Equation 1}$$

where, in Equation 1, $V_C$ is a volume of the conductive material within each of the sensing electrodes, and $V_T$ is a total volume of each of the sensing electrodes.

4. The foldable display device of claim 1, wherein the second conductive material comprises at least one of Al, Ti, Cu, Ag, Au, Pt, Mo, a silver-palladium-copper alloy (APC), a silver-palladium alloy(AP), indium tin oxide (ITO), indium zinc oxide (IZO), or indium gallium zinc oxide (IGZO).

5. The foldable display device of claim 1, wherein each of the first conductive layer and the third conductive layer does not have an air layer.

6. The foldable display device of claim 1, wherein:
   each of the first and third conductive materials comprises Ti; and
   the second conductive material comprises Al.

7. The foldable display device of claim 1, wherein:
   the display panel comprises:
   a base substrate;
   a thin film transistor disposed on the base substrate; and
   an organic electroluminescent device connected to the thin film transistor,
   wherein the base substrate comprises at least one of polyethylene terephthalate (PET), polyethylene naphthalate (PEN), polyimide, or polyether sulfone.

8. The foldable display device of claim 7, wherein:
   the display panel further comprises an encapsulation layer disposed on the organic electroluminescent device to seal the organic electroluminescent device;
   the touch sensing unit is disposed on the encapsulation layer; and
   the encapsulation layer and the touch sensing unit contact each other.

9. The foldable display device of claim 1, wherein each of the sensing electrodes has light transmittance of about 80% to about 95%.

10. The foldable display device of claim 7, wherein:
    the organic electroluminescent device comprises a light emitting layer; and
    light emitted from the organic electroluminescent device is polarized while passing through the sensing electrodes.

11. The foldable display device of claim 1, wherein each of the sensing electrodes has an optical anisotropy.

12. The foldable display device of claim 1, wherein:
    at least a portion of the sensing electrodes is provided in the bent touch portion; and
    the foldable display is configured to operate in a first mode in which the at least the portion of the sensing electrodes is bent or a second mode in which the bent touch portion is unfolded.

13. A method for fabricating a foldable display device, the method comprising:
    providing a substrate and a deposition source within a chamber;

disposing a grid layer between the substrate and the deposition source within the chamber in a direction parallel to the substrate, wherein the grid layer is disposed more adjacent to the substrate than the deposition source; and depositing a conductive material on the substrate to provide one or more sensing electrodes, wherein:

the providing of the sensing electrodes comprises:
disposing the substrate and the deposition source so that a deposition angle between the substrate and the deposition source is equal to or more than about 40 degrees to less than about 70 degrees; and
depositing the conductive material on the substrate, wherein the deposition angle is defined as an angle between a virtual first plane and a virtual second plane on a tangent at which the virtual first plane extending from the substrate and the virtual second plane extending from the deposition source meet each other.

14. The method of claim 13, wherein:
the depositing of the conductive material is performed while the substrate rotates; and
the substrate has a rotation rate of about 0.2 rpm to about 1 rpm.

15. The method of claim 13, wherein the depositing of the conductive material comprises depositing a conductive material comprising at least one of Al, Ti, Cu, Ag, Au, Pt, Mo, a silver-palladium-copper alloy (APC), a silver-palladium alloy(AP), indium tin oxide (ITO), indium zinc oxide (IZO), or indium gallium zinc oxide (IGZO).

16. The method of claim 13, wherein the providing of the sensing electrodes comprises depositing the conductive material at a thickness of about 40 nm to about 60 nm.

17. The method of claim 13, wherein the providing of the sensing electrodes comprises depositing the conductive material so that each of the sensing electrodes satisfies Equation 1:

$$0.2 \leq V_C/V_T \leq 0.6 \qquad \text{Equation 1}$$

where, in Equation 1, $V_C$ is a volume of a conductive material within each of the sensing electrodes, and $V_T$ is a total volume of each of the sensing electrodes.

18. The method of claim 13, further comprising preparing the substrate before the providing of the substrate and the deposition source within the chamber, wherein the preparing of the substrate comprises:
preparing a base substrate comprising at least one of polyethylene terephthalate (PET), polyethylene naphthalate (PEN), polyimide, or polyether sulfone;
providing a thin film transistor on the base substrate; and
providing an organic electroluminescent device connected to the thin film transistor.

* * * * *